US 7,557,563 B2
Jul. 7, 2009

(12) United States Patent
Gunn et al.

(54) CURRENT SENSOR ASSEMBLY

(75) Inventors: Colin N. Gunn, Victoria (CA); Stewart J. Harding, Victoria (CA); Marc A. Ricci, Victoria (CA); Daniel N. Loewen, Sidney (CA); Peter C. Cowan, Victoria (CA); Martin A. Hancock, Victoria (CA)

(73) Assignee: Power Measurement Ltd., Saanichton, British Columbia (CA)

( * ) Notice: Subject to any disclaimer, the term of this patent is extended or adjusted under 35 U.S.C. 154(b) by 69 days.

(21) Appl. No.: 11/335,793

(22) Filed: Jan. 19, 2006

(65) Prior Publication Data
US 2006/0279910 A1    Dec. 14, 2006

Related U.S. Application Data

(60) Provisional application No. 60/645,317, filed on Jan. 19, 2005.

(51) Int. Cl.
*G01R 15/18* (2006.01)
(52) U.S. Cl. .................................. 324/127; 324/117 H
(58) Field of Classification Search ................. 324/127, 324/117 R, 117 H, 158.1
See application file for complete search history.

(56) References Cited

U.S. PATENT DOCUMENTS

| 1,251,260 | A |   | 12/1917 | Manuel |
|---|---|---|---|---|
| 1,258,094 | A |   | 3/1918 | Darlington |
| 1,258,095 | A |   | 3/1918 | Davis |
| 1,258,096 | A |   | 3/1918 | Davison |
| 1,258,097 | A |   | 3/1918 | Day |
| 1,258,098 | A |   | 3/1918 | Lorme |
| 1,929,714 | A | * | 10/1933 | Reich .......................... 324/115 |
| 2,741,321 | A |   | 4/1956 | McCoy et al. ................ 174/144 |

(Continued)

FOREIGN PATENT DOCUMENTS

WO    WO 96/01432    1/1996

(Continued)

OTHER PUBLICATIONS

Guildline, Clampere, Clamp-On Active Current Transformer 3015, "Major Breakthrough in Precision," Current, Power & Energy Measurements, © 1998 Guildline Instruments.

(Continued)

*Primary Examiner*—Ha Tran T Nguyen
*Assistant Examiner*—Richard Isla Rodas
(74) *Attorney, Agent, or Firm*—Brinks Hofer Gilson & Lione

(57) ABSTRACT

A sensor apparatus for measuring power parameters on a power conductor, such as a high voltage transmission line may include a corona structure, an electronics assembly and a conductor mountable device. The corona structure may define an outer boundary surrounding the electronics assembly and the conductor mountable device. The corona structure may shield the electronic assembly and conductor mountable device from a corona produceable with the power conductor. The conductor mountable device may be a power parameter measurement device, such as a current sensor assembly. The current sensor assembly may be a split-core design that includes multiple transformer cores. The electronics assembly and the conductor mountable device may powered from a line voltage suppliable on the power conductor. Data may be wirelessly transmitted and received with the sensor apparatus.

38 Claims, 14 Drawing Sheets

U.S. PATENT DOCUMENTS

| | | | |
|---|---|---|---|
| 3,153,758 A | 10/1964 | Kusters et al. | |
| 3,471,633 A | 10/1969 | Kaminski, Jr. | 174/144 |
| 3,534,247 A | 10/1970 | Miljanic | |
| 4,255,704 A | 3/1981 | Milkovic | |
| 4,268,818 A | 5/1981 | Davis et al. | 340/870.38 |
| 4,384,289 A | 5/1983 | Stillwell et al. | |
| 4,422,039 A | 12/1983 | Davis | |
| 4,611,207 A | 9/1986 | Anderson et al. | |
| 4,629,974 A | 12/1986 | Friedl | |
| 4,635,055 A * | 1/1987 | Fernandes et al. | 340/870.17 |
| 4,689,752 A | 8/1987 | Fernandes et al. | |
| 4,709,339 A | 11/1987 | Fernandes | |
| 4,714,893 A * | 12/1987 | Smith-Vaniz et al. | 324/126 |
| 4,723,220 A | 2/1988 | Smith-Vaniz | 702/62 |
| 4,724,381 A | 2/1988 | Crimmins | |
| 4,728,887 A | 3/1988 | Davis | 324/127 |
| 4,746,241 A | 5/1988 | Burbank, III | 403/344 |
| 4,758,962 A * | 7/1988 | Fernandes | 702/62 |
| 4,777,381 A | 10/1988 | Fernandes | |
| 4,786,862 A | 11/1988 | Sieron | |
| 4,794,327 A | 12/1988 | Fernandes | |
| 4,794,328 A | 12/1988 | Fernandes et al. | |
| 4,795,973 A | 1/1989 | Smith-Vaniz et al. | |
| 4,796,027 A | 1/1989 | Smith-Vaniz | |
| 4,799,005 A * | 1/1989 | Fernandes | 324/127 |
| 4,806,855 A | 2/1989 | Davis | 324/127 |
| 4,808,916 A * | 2/1989 | Smith-Vaniz | 324/110 |
| 4,808,917 A | 2/1989 | Fernandes et al. | |
| 4,829,298 A * | 5/1989 | Fernandes | 340/870.27 |
| 4,841,236 A | 6/1989 | Miljanic et al. | |
| 4,847,780 A | 7/1989 | Gilker et al. | |
| 4,855,671 A | 8/1989 | Fernandes | |
| 4,884,038 A | 11/1989 | Miljanic | |
| 4,886,980 A | 12/1989 | Fernandes et al. | |
| 4,894,785 A | 1/1990 | Fernandes | 364/483 |
| 4,904,996 A | 2/1990 | Fernandes | 340/870.07 |
| 4,967,145 A | 10/1990 | Davies | |
| 5,124,642 A | 6/1992 | Marx | |
| 5,276,394 A | 1/1994 | Mayfield | |
| 5,307,008 A | 4/1994 | So | |
| 5,341,088 A * | 8/1994 | Davis | 324/106 |
| 5,343,184 A * | 8/1994 | Matsui et al. | 336/92 |
| 5,426,360 A * | 6/1995 | Maraio et al. | 324/126 |
| 5,650,936 A | 7/1997 | Loucks et al. | |
| 5,959,818 A | 9/1999 | Blakely | |
| 5,995,911 A | 11/1999 | Hart | |
| 6,018,700 A | 1/2000 | Edel | |
| 6,046,582 A | 4/2000 | Sanelli et al. | |
| 6,064,192 A | 5/2000 | Redmeyer | |
| 6,191,673 B1 * | 2/2001 | Ogura et al. | 336/84 R |
| 6,417,661 B1 | 7/2002 | Berkcan et al. | |
| 6,433,981 B1 | 8/2002 | Fletcher et al. | |
| 6,470,283 B1 | 10/2002 | Edel | |
| 6,493,644 B1 | 12/2002 | Jonker et al. | |
| 6,756,776 B2 * | 6/2004 | Perkinson et al. | 324/127 |
| 6,825,650 B1 | 11/2004 | McCormack et al. | |
| D532,747 S | 11/2006 | Ricci et al. | |
| D534,120 S | 12/2006 | Ricci et al. | |
| 7,282,944 B2 | 10/2007 | Gunn et al. | 324/771 |
| 2004/0137217 A1 | 7/2004 | Tomoto et al. | |
| 2004/0183522 A1 | 9/2004 | Gunn et al. | |
| 2005/0017751 A1 | 1/2005 | Gunn et al. | 324/771 |
| 2005/0288876 A1 | 12/2005 | Doig et al. | |
| 2005/0288877 A1 | 12/2005 | Doig et al. | |
| 2006/0216079 A1 | 9/2006 | Nanjo | 399/333 |
| 2006/0284647 A1 | 12/2006 | Gunn et al. | |

FOREIGN PATENT DOCUMENTS

| | | |
|---|---|---|
| WO | WO 2005/013650 | 2/2005 |
| WO | WO 2006/007000 | 1/2006 |

OTHER PUBLICATIONS

Ripka, P., "Current Sensors Using Magnetic Materials," Journal of Optoelectronics and Advanced Materials, vol. 6, No. 2, pp. 587-592, Jun. 2004.

Engelhardt, J.S., Basu, S.P., Design, Installation, and Field Experience with an Overhead Transmission Dynamic Line Rating System, pp. 366-368, 0-7803-3522-8/96 © IEEE 1996.

The Ion Wire, Energy News from Power Measurement, Sep. 2005, Issue 52.

U.S. Appl. No. 11/938,613, filed Nov. 12, 2007, Gunn et al.

Brubaker, M.A., Hamilton, P.J., Yakmyshyn, C.P., "Remote Real-Time Measurements of Voltage, Current and Energy," Wireless Technologies in the Power Industry Workshop, May 5-6, 2005, Toronto, Canada © 2005 FieldMetrics, Inc. (FMI), pp. 1-27.

* cited by examiner

CURRENT SENSOR ASSEMBLY

This application claims the benefit pursuant to 35 U.S.C. §119(e) of U.S. Provisional Patent Application Ser. No. 60/645,317 filed on Jan. 19, 2005, which is herein incorporated by reference in its entirety.

BACKGROUND

Instrument transformers for installation on high voltage transmission lines, which may include those transformers used for protective relay and metering, are large and expensive. This is especially true for instrument transformers designed for applications involving high transmission line voltages. It is also very costly to replace instrument transformers due to the necessity to power down the transmission line during the replacement. One type of instrument transformers are referred to as current transformers (CTs). CTs may be used to measure a flow of current.

Current transformer reclassification is the process of taking an existing current transformer (CT) and recalibrating it, using calibration constants. The calibration constants may be used to modify the current measurements performed by the CT to improve the accuracy of the measured current sensor.

A current transformer reclassification ("sensor") apparatus may be used to aid in the reclassification of an existing installed CT. In addition, a sensor apparatus may be used to verify end to end system accuracy of CT measurement points in a substation, switchyard, or other location. A sensor apparatus can also be utilized to verify the accuracy and/or operability of new equipment coupled with a transmission line. Currently, meters and instrument transformers are calibrated independently in a lab before being installed as a complete system in the field. However, once installed in the field there is no simple or cost effective way to verify the entire system's accuracy.

SUMMARY

The invention relates to a system, apparatus and method for measuring power parameters on a power line. More particularly, the disclosed embodiments relate to a mechanical design and a system operable to be installed and monitor power parameters on a power line, such as a high voltage power line. The system may also include mechanisms to enable compensation for inaccuracies in the output of instrument transformers. The disclosed embodiments include a sensor apparatus that is accurate, self contained, easy to install, and easy to use.

The disclosed sensor apparatus may include a corona frame and a conductor mountable device. The corona frame may be an open structure that provides an outer envelope and an inner volume in which corona discharge may be minimized. The conductor mounted device may be a power parameter measurement device that is a current sensor assembly. The current sensor assembly may be a split core design that includes a housing that can contain operating logic and electronic devices, such as a power supply and compensation circuitry. The current sensor assembly may also include a mechanism to transition a first housing assembly and a second housing assembly that form the housing between an open position and a closed position.

The current sensor assembly may also include a carrier. The carrier may be disposed in the housing and contain a plurality of current transformer cores. In a split core design, the discrete portions of the carrier may be included in both the first housing assembly and the second housing assembly, and contain discrete portions of the current transformer cores. The carrier, current transformer cores and corresponding current transformer windings may form a winding assembly. Discrete portions of the winding assembly may be included in each of the first and second housing assemblies. The carrier and winding assembly may be moveable within the respective housing assemblies to enable contiguous alignment of the discrete core portions when the current sensor assembly is placed a closed position.

The sensor apparatus may also include a global positioning system (GPS) and/or time-syncing capabilities to allow end to end accuracy verification of the instrument transformers in a power system. In addition, the sensor apparatus may include an antenna(s) providing telemetry data and/or receiving GPS timing/position data to enable communication with, and use of, the installed sensor apparatus. The sensor apparatus may also include one or more coupling devices. The coupling devices may be insulated from the corona frame of the sensor apparatus. Further, the sensor apparatus may include environmental protective features to extend the service life of the sensor apparatus. The sensor apparatus may also include a post installation auto-positioning feature using weight distribution, and an installation guide frame, all of which may provide for easier installation and the ability to install the sensor apparatus on a live power line without having to first interrupt and/or de-energize the line.

Some embodiments of the sensor apparatus may feature an open corona frame or open corona structure. The open corona frame may allow for modularity in the design, by allowing the addition of components without requiring that those additional components feature a smooth exterior or larger bend radius as is typically required by corona discharge reduction practices. The open frame also enables RF communication with the sensor apparatus and enables capacitive body electric field powering of the sensor apparatus rather than powering the sensor apparatus directly from the magnetic field of a power line or from an energy storage device such as a battery. The open corona frame may include one or more members that are formed as closed curves to minimize weight and wind resistance when the sensor apparatus is operational.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION

Figure 1:
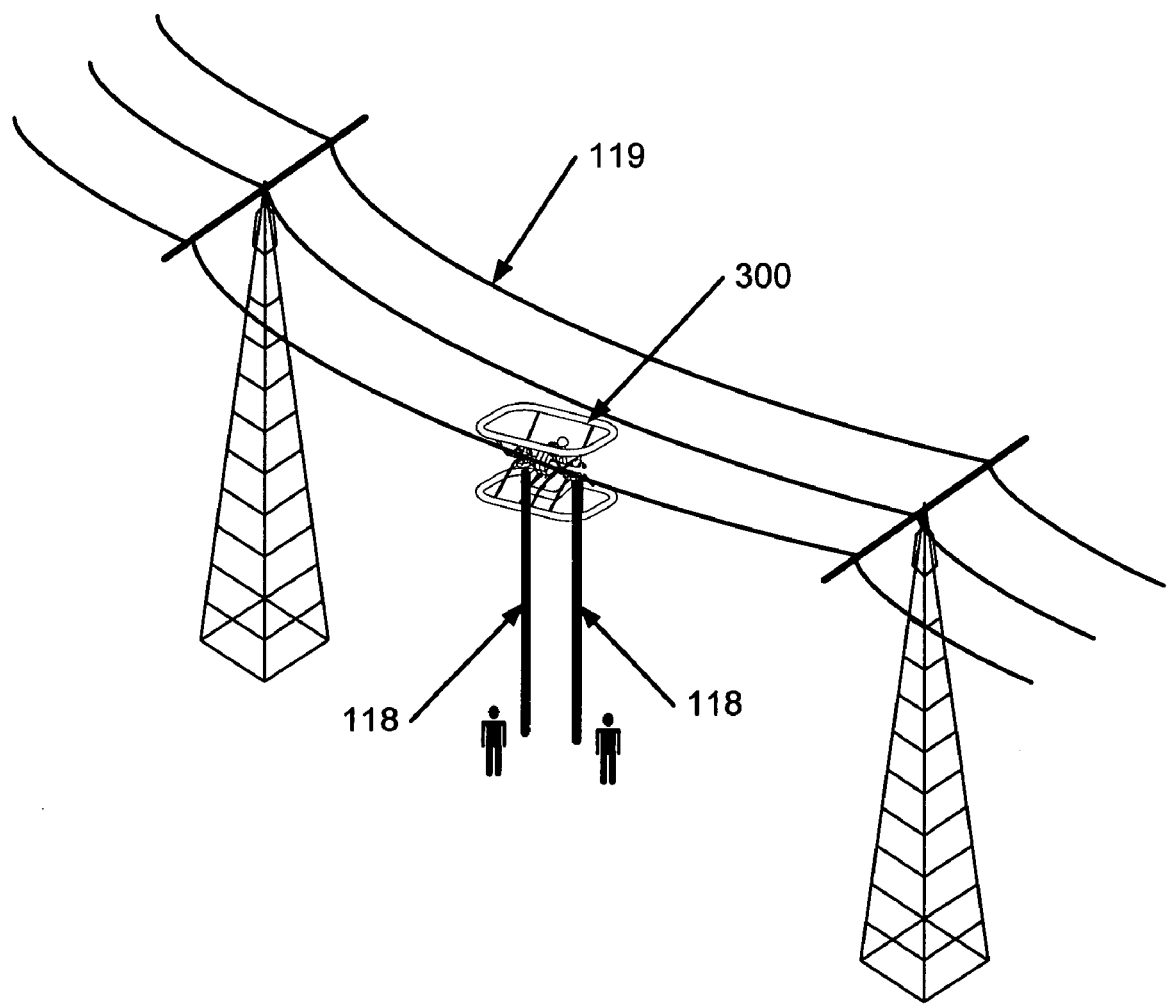
FIG. 1 illustrates one embodiment of a sensor apparatus installed on a power conductor.

FIG. 1 illustrates a sensor apparatus 300, or sensor structure installed on a power conductor 119. The power conductor 119 may be a high voltage transmission line or any other form of power supply line or power supply mechanism capable of conducting a line voltage and a line current. In one application, the sensor apparatus 300 may be designed for high voltage (HV) substation installation, such as with voltage levels from 38 kV to 765 kV. In other applications, the sensor apparatus 300 may be designed for any other voltage level and/or any other installation location. Example installation locations include transmission lines, conductors, generator terminals, switchgear, motor terminals, a bus, a bus duct, a bus tube, a switch yard, and/or any other location where power flows through a power conductor 119. It will be appreciated that particular performance characteristics of the sensor apparatus 300 may be implemented dependent upon the particular application in which the sensor apparatus 300 is to be deployed.

During installation, the sensor apparatus 300 may be placed onto the power conductor 119 while the power conductor 119 is "live," using one or more hot sticks 118. The hot sticks 118 may be any form of longitudinally extending non-conducting rod having a proximate end configured to be handled by a user, and a distal end configured to interface with a device, such as the sensor apparatus 300. The hot sticks 118 may permit the manual installation of the sensor apparatus 300 while a user of the hot stick 118 may be positioned remote from the sensor apparatus 300. Thus a user performing such an installation may be spaced away not only from the sensor apparatus 300, but also from line voltage and line current that may be present on the power conductor 119. Accordingly, the sensor 300 may be installed without deactivation of the voltage and current flow through the power conductor 119.

Figure 2:
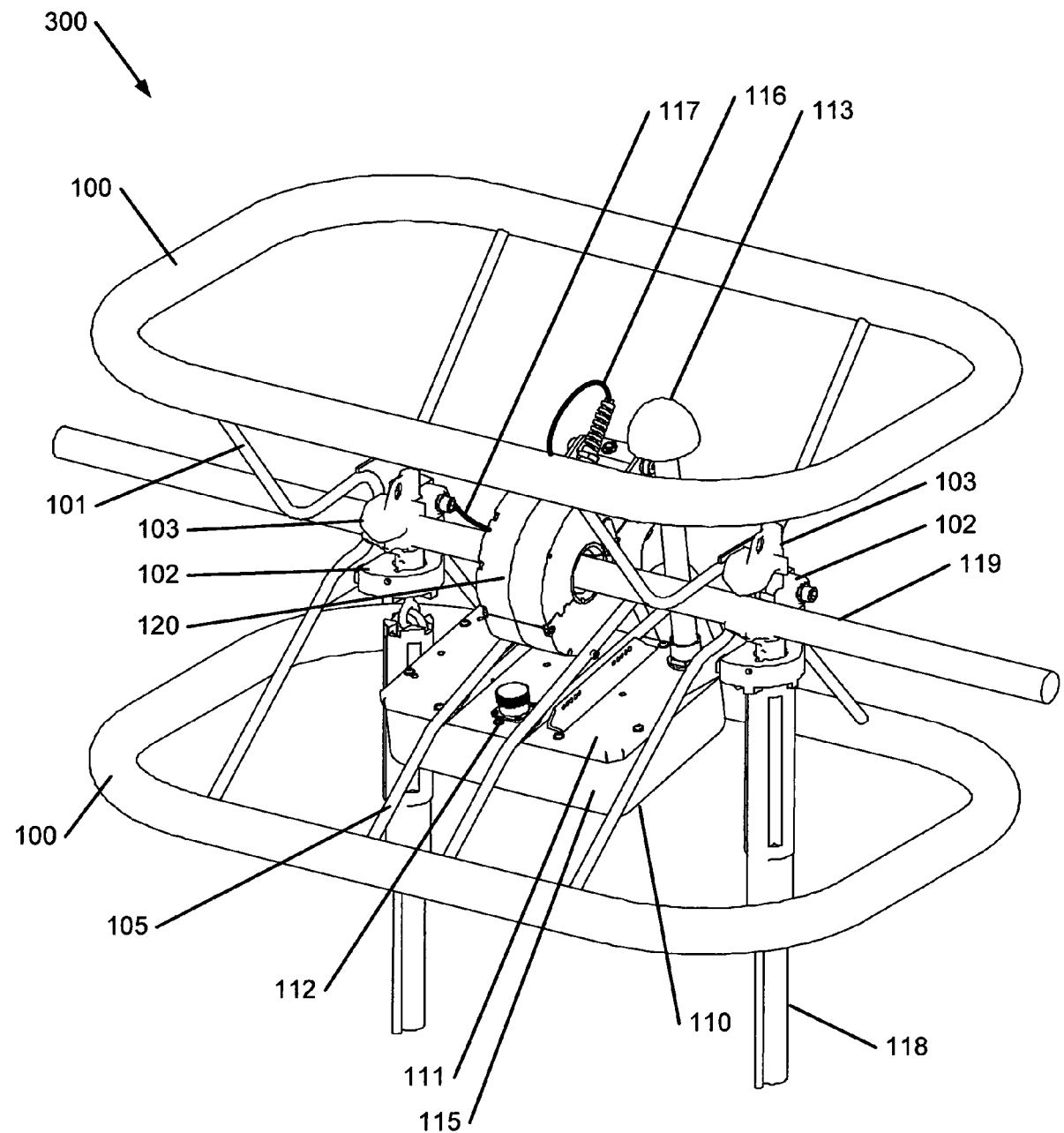
FIG. 2 illustrates a perspective view of the power conductor and an embodiment of the sensor apparatus of FIG. 1.

FIG. 2 is a perspective view of an example of an example sensor apparatus 300. The sensor apparatus 300 may be coupled with the power conductor 119 with one or more coupling devices 103, such as a clamp, or any other fastener mechanism that maintains the sensor 300 in a desired position with respect to the power conductor 119. In addition, the sensor apparatus 300 may include a conductor mountable device that couples to the power conductor 119. The conductor mountable device may be a measurement device, such as a current sensor assembly, capable of measuring power parameters. Because the sensor apparatus 300 may be manually lifted onto the power conductor 119 it may be advantageous for the sensor apparatus 300 to be as light as possible.

During operation, the sensor apparatus 300 may be located in an outdoor environment and may be subjected to a wide range of weather conditions. Thus, the sensor apparatus 300 may be designed to be protected from weather, temperature, water, corrosion, oxidation, sunlight and/or any other elements, such as through the use of sealed connectors, weather tight enclosures, corrosion resistant materials, and/or any other methods or devices for environmental protection.

The sensor apparatus 300 may contain a corona structure 100 formed to reduce the effects of corona discharge. Corona discharges may form when the intensity of an electric field produced in the vicinity of a power conductor 119 by a line voltage and line current thereon exceeds the breakdown strength of air. During such corona discharges, localized ionization of the air occurs. Radio interference may be caused and material properties may degrade where corona discharge occurs. Corona discharge is elevated by sharp edges on conducting areas of an apparatus where the electric field gradient is sufficiently high. To reduce corona discharge, the corner radii of objects employed in high voltage applications are often smoothed. In addition, objects with sharp edges may be effectively shielded from corona discharge by surrounding them at least partially by objects having large radiuses of curvature (for example corona rings) that may be operated at a potential similar to the line voltage.

The sensor apparatus 300 and associated electronics may be powered indirectly from an electric field generated by the power conductor 119 utilizing a free body capacitance of the corona structure 100. The free body capacitance of the corona structure 100 may be charged and discharged as a function of a sinusoidal waveform of the line voltage. The physical size of the corona structure 100 may vary since an inverse relationship may exist between the size of the corona structure 100 and the power generation for the sensor apparatus 300. For example the electric field provided by a power conductor 119 carrying a 138 kV line-to-line voltage may result in the generation of about 3.5 watts of power with a configuration of the sensor apparatus 300. The same configuration of the sensor apparatus 300, however, may generate about 7.0 watts of power in a power conductor 119 carrying a 230 kV line-line voltage. Thus with a fixed power requirement such as 3.5 watts, as the power conductor 119 line-to-line voltage measurement increases, the relative size of the corona structure 100 may be decreased.

There also may be a direct relationship between a magnitude of voltage on the power conductor 119 and a radius of the corona structure 100 to enable a desirably reduced corona discharge. Accordingly, based on these relationships with decreased voltage on the power conductor 119, there comes a point where the electric field may no longer meet the power needs of the sensor apparatus 300. An alternate power source, such as a battery, may also be used to power the sensor apparatus 300. In this situation, the sensor apparatus 300 might be used without the corona structure 100. Likewise, as the voltage on the power conductor 119 increases the corona structure 100 can be reduced in size, but the size reduction may be limited by the size of radii required. In an alternate embodiment, the corona structure 100 may be modularly constructed to adjust the size of corona shield provided by the corona structure to suit the specific line voltage of the power conductor 119.

Referring now to FIGS. 2 through 5, in one embodiment the sensor apparatus 300 comprises the corona structure 100, guide braces 101, insulators 102, coupling devices 103, an electronics assembly 110 and a current sensor assembly 120. In other examples, the electronics assembly 110 may be incorporated into and form a part of the current sensor assembly 120.

The corona structure 100 may be a frame that is operable to serve a plurality of functions. First the corona structure 100 may be a corona shield that distributes the electric field to minimize the formation of corona on the overall assembly. In other words, the electric field potential of a line voltage present on a power conductor 119 may be reduced to non-ionizing levels within the corona structure 100. The electric field may be distributed by presenting a large conductive radius of curvature and shielding the smaller radius of curvature devices included within an envelop defined by the corona structure 100. In this embodiment the corona structure 100 may include one more frame members extending in a predetermined shape with large radius corners to distribute the electric field. Second the corona structure 100 may provide enough free body capacitance to power the sensor apparatus 300. Third the corona structure 100 may provide locations to mount various sub-assemblies and components included in the sensor apparatus 300.

The corona structure 100, or corona shield structure, or corona frame, may be a one or more continuous open framework structures formed from one or more members of a conductive material. Where there are multiple member components, non-continuous member components may be coupled together to form a continuous corona structure 100. The continuous corona structure 100 may be an open framework of members that longitudinally extend to define apertures therebetween. Alternatively, some of the non-continuous members may be formed with gaps such that the corona structure is not continuous, but is instead formed in segments with gaps of a determined length between the segments.

The one or more members may also be formed as one or more closed curves, or closed plane curves. As used herein a "closed curve" is defined as any material or structure formed with one or more members, no endpoints, and which encloses an area. A "closed plane curve" is defined as any material or structure formed with one or more members that resides in a single plane with no endpoints and which encloses an area.

In one example, the corona material may be formed as one or more elongated, hollow, tubular, light weight, weather proof, conductive members. For example, the corona material may be aircraft tubing formed with aluminum or some other suitable tubing formed with conductive material. In other examples, the corona structure 100 may be formed with one or more members that are solid materials, and/or materials in any other cross-sectional shapes, that can be formed as a plane curve, and/or a closed plane curve. In addition, the corona structure may allow for ease of installation, provide electrical conductivity and have the ability to withstand adverse environmental situations. Alternatively the corona structure 100 may be formed with one or more materials that are non-conductive materials covered with a conductive coating.

The corona structure 100 may include one or more corona frame structures. In the illustrated embodiments the corona structure 100 comprises two corona frame structures formed with tubular frames. Each of the corona frame structures may be closed plane curves that are formed as toroids. In other examples, other shapes and quantities of corona frame structures are possible. For example, the corona structure 100 may be a single continuous corona frame structure formed as a helical coil, a plurality of corona frame structures forming segments that are spaced away from each other, or a single closed curve corona frame structure.

In FIGS. 2-5, the corona frame structures reside in separate planes on opposite sides of the sensor apparatus 300. In addition, the corona frame structures may be positioned to be substantially parallel with respect to each other. In other examples, the corona frame structures may reside in planes that are non-parallel, or that may form intersecting planes. In still another example, the sensor apparatus 300 may include a single corona frame structure, or three or more corona frame structures.

During operation, the illustrated corona frame structures may be positioned on opposite sides of the power conductor 119 to create an outer boundary of the sensor apparatus 300 that surrounds a portion of the power conductor 119. In addition, an inner volume may be present within an envelop formed between the corona frame structures and the power conductor 119. Within the inner volume, the electric field may be lowered so creation of corona by any objects with sharp edges is minimized. Other shaped corona frame structures, such as a circle, an ellipse, etc. may also be used for the corona structure 100 so long as the conductive radius of curvature(s) included in the shape are capable of distributing the electric field to the desired degree. Further, the members that comprise the corona structure 100 may be fashioned using multiple members or forms that emulate a larger radius of curvature. In this way, the same large radius of curvature of the corona structure 100 is not required for objects that reside inside the volume defined by the corona frame structure(s) of the corona structure 100.

The corona structure 100 may be connected with guide braces 101 that form a guide brace structure. The guide braces 101 may be formed of a lightweight, low density solid or hollow material with sufficient rigidity to perform the functionality described. In the illustrated embodiment, the guide braces are tubular structures. In other examples, other cross-sectional geometries and/or multiple cross-sectional geometries may be used. Each of the guide braces 101 may be continuous members, or struts, that extend radially outward and are coupled with one or more of the corona frame structures.

The guide braces 101 in combination with corona structure 100 may form a continuous open framework of interconnected members. The interconnected members may be coupled to define a plurality of apertures, air spaces, or cells within the sensor apparatus 300. In addition, the interconnected members may longitudinally extend a predetermined length that is substantially larger than a cross-sectional area of the interconnected members. In the illustrated example, the guide braces 101 are struts with each end connected with a different one of the corona frame members. A mid-section of each of the guide braces 101 is formed to extend to a central region of the sensor apparatus 300 and be coupled with the mounting plate 104.

The guide braces 101 may also be formed in a guide brace structure. The guide base structure may maintain the corona structure 100 in a determined position with respect to a power conductor 119 when the sensor apparatus 300 is installed. The guide braces 101 may also provide support and/or coupling locations for the coupling devices 103, the electronics assembly 110 and the current sensor assembly 120. In addition, the guide braces 101 may include a conductor guide portion that is formed to assist in guiding the power conductor 119 when a power conductor 119 comes into contact with the conductor guide portion of the guide braces.

During installation of the sensor apparatus 300, the conductor guide portion may be utilized to help channel the power conductor 119 towards the coupling devices 103 and the current sensor assembly 120. Accordingly, the conductor guide portion of the guide braces may reposition the sensor apparatus 300 with respect to the power conductor 119 so that the coupling devices 103 and the current sensor assembly 120 are moved into a desired predetermined alignment with respect to the power conductor 119.

Figure 3:
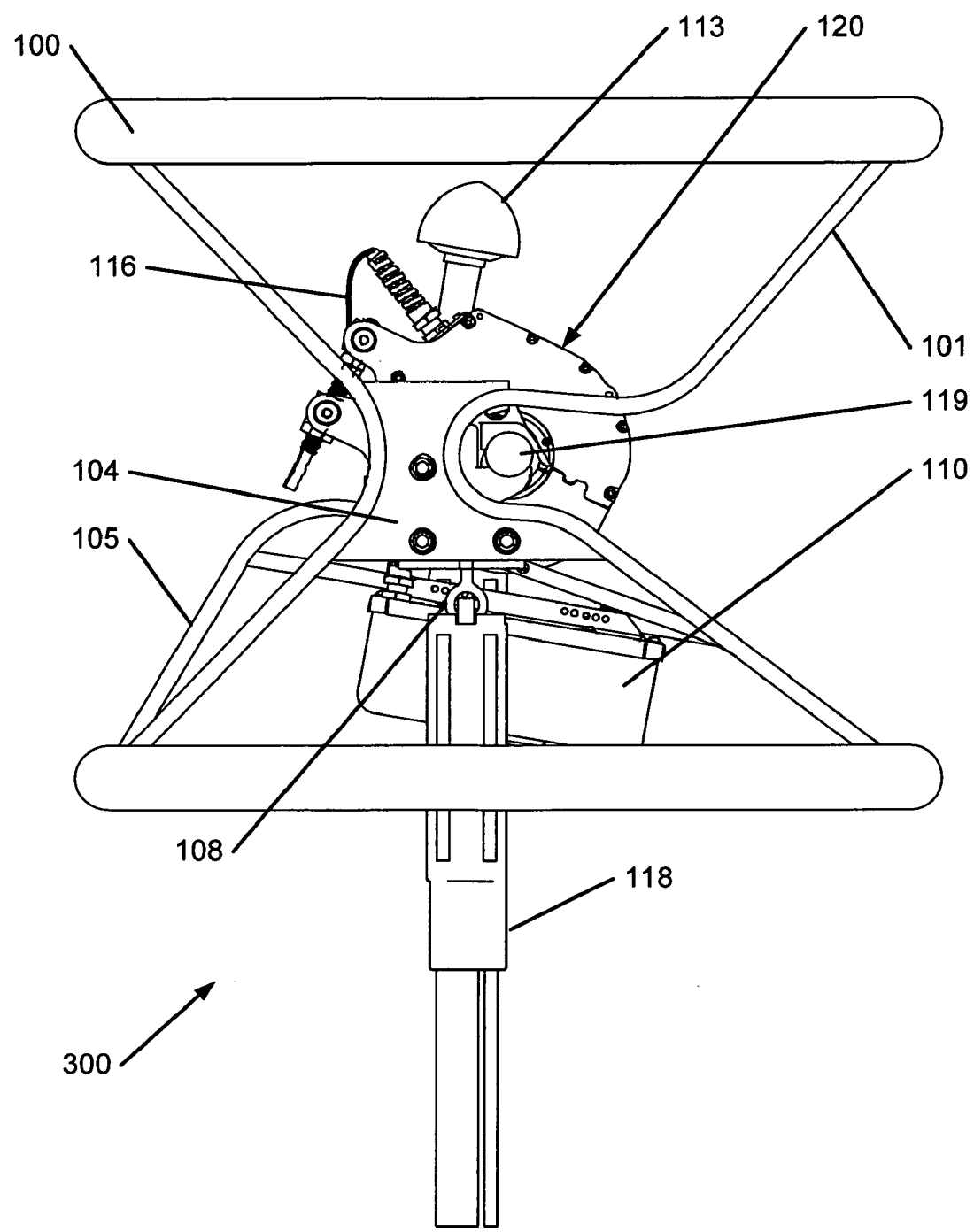
FIG. 3 illustrates a side view of the power conductor and the sensor apparatus of FIG. 2.
Figure 4:
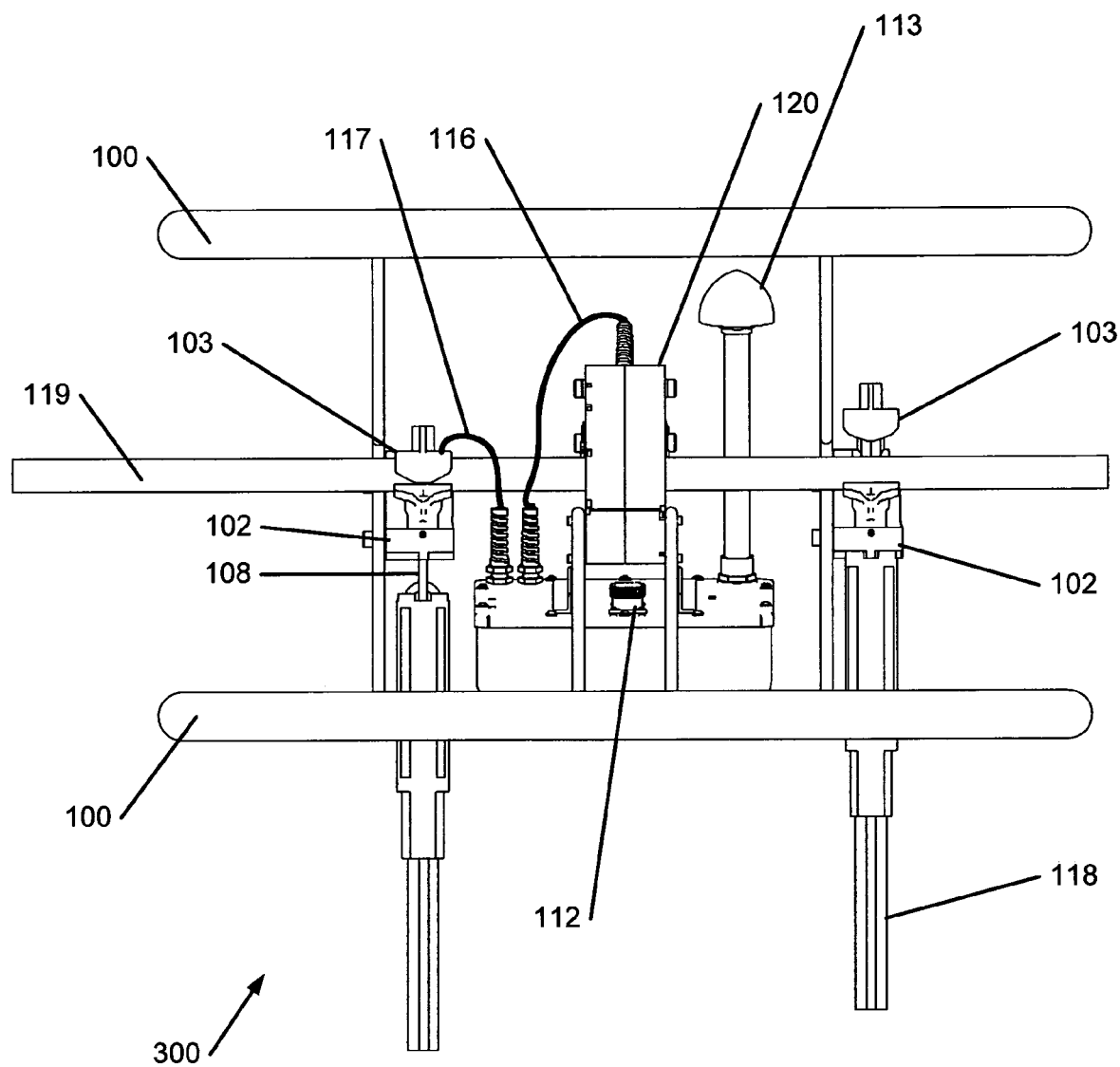
FIG. 4 illustrates the power conductor and a back view of the sensor apparatus of FIG. 2.
Figure 5:
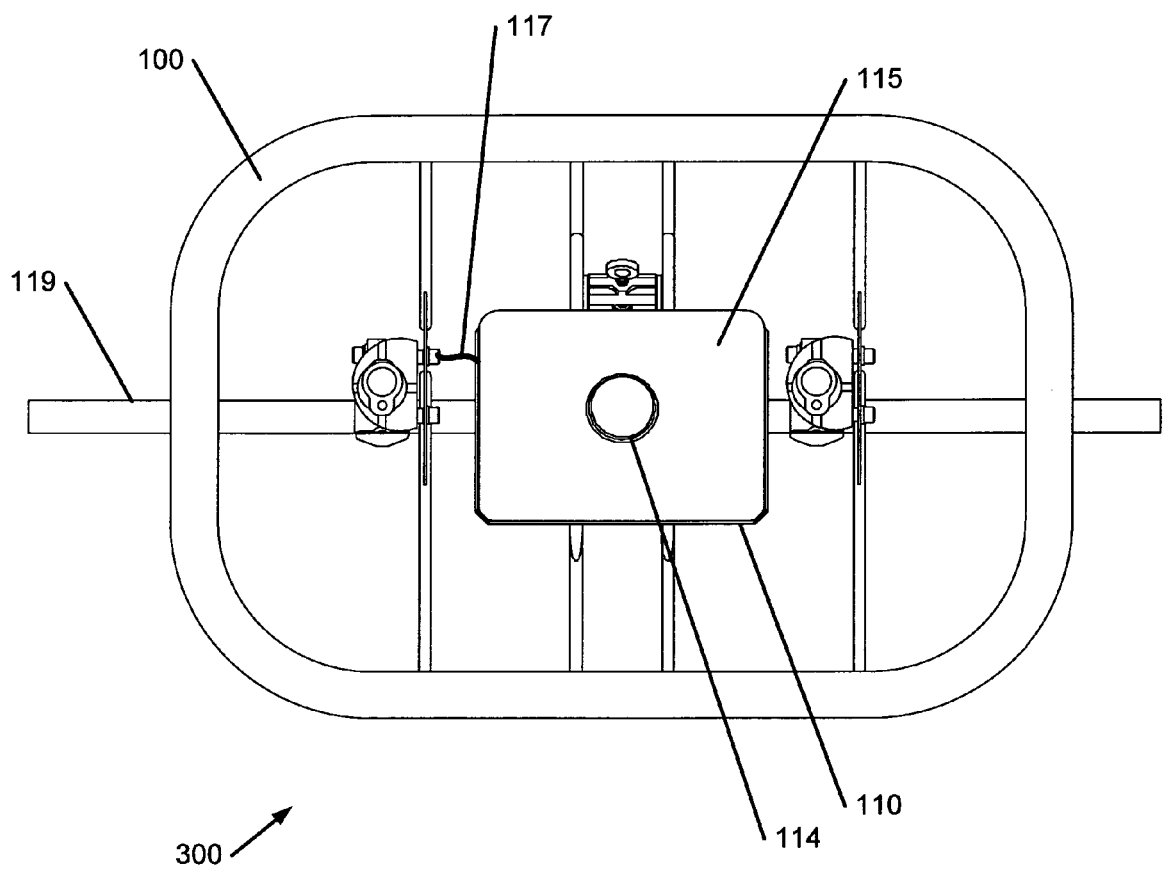
FIG. 5 illustrates the power conductor and a bottom view of the sensor apparatus of FIG. 2.

As seen in FIGS. 3 and 4, a mounting plate 104 may be coupled with the guide braces 101. The mounting plate 104 may provide a mounting position for the insulating blocks 102. In addition, the mounting plate 104 may substantially eliminate independent movement of the guide braces 101, and fixedly maintain the position of the guide braces 101 with respect to each other. In other examples, the guide braces 101 may be fixedly maintained in position by welding, fasteners, or any other rigid coupling mechanism. A mounting bar 105 may also provide a location to mount both the current sensor assembly 120 and the electronics assembly 110. In one embodiment, the current sensor assembly 120 is mounted directly above the electronics assembly 110, which allows for proper weight distribution of the sensor apparatus 300 after installation and allows for self leveling in a desired position when the sensor apparatus 300 is installed on a power conductor 119.

After installation, the current sensor assembly 120 may be concentric with the power conductor 119. The electronics assembly 110 may be mounted on a lower portion of the sensor apparatus 300 such that the center of gravity of the sensor apparatus 300 may be below the power conductor 119. The electronics assembly 110 may be positioned to be at a determined angle below the current sensor assembly 120 to improve environmental resistance by enabling water to run off the electronics assembly 110 without collecting thereon.

Referring back to FIG. 2, each of the insulating blocks 102 may include an engagement mechanism 108 that is electrically isolated from the coupling device 103. In FIG. 2, the example engagement mechanisms 108 are threaded members. Each of the engagement mechanisms 108 may be selectively engaged with a hot stick 118. The hot sticks 118, once engaged with the engagement mechanisms 108, may be used to mount the complete sensor apparatus 300 to a power conductor 119. The insulating blocks 102 may also connect the coupling devices 103 to the corona structure 100, while maintaining electrical isolation therebetween. Thus, the coupling device 103 may be at the voltage level of the power conductor 119, while the insulating blocks 102 may maintain the remainder of the sensor apparatus 300 at a lower potential.

As described later, the ability to maintain a portion of the sensor apparatus 300 at a lower potential enables the sensor apparatus to generate power as a function of the line voltage present on the power conductor 119 and an effective body capacitance of the corona structure 100. The effective body capacitance of an object, such as the corona structure 100, is a combination of a free body capacitance of the object, the effect of the body with respect to earth, and the effect of the body with respect to other objects. Free body capacitance generally refers to the capacitance of an object in free space.

The coupling devices 103 may be used to maintain the positional relationship between the sensor structure 300 and a power conductor 119. The coupling devices 103 may be formed of a conductive material that electrically couples one side of a primary winding of a power supply included in the sensor structure 300 to the power conductor 119, while maintaining electrical isolation from the rest of the structure through the insulating blocks 102. The coupling devices 103 may be remotely opened and closed from a distance using a hot stick 118 during installation or removal of the sensor apparatus 300 from a power conductor 119. In one embodiment the coupling devices 103 are opened and closed using the engagement mechanism 108, such as a threaded member or an I-bolt. Other forms of engagement mechanisms and mechanical closing means may also be used, such as a ratchet, spring loaded clamps and/or any other mechanism to maneuver the coupling devices 103 between an opened and a closed position.

Figure 6:
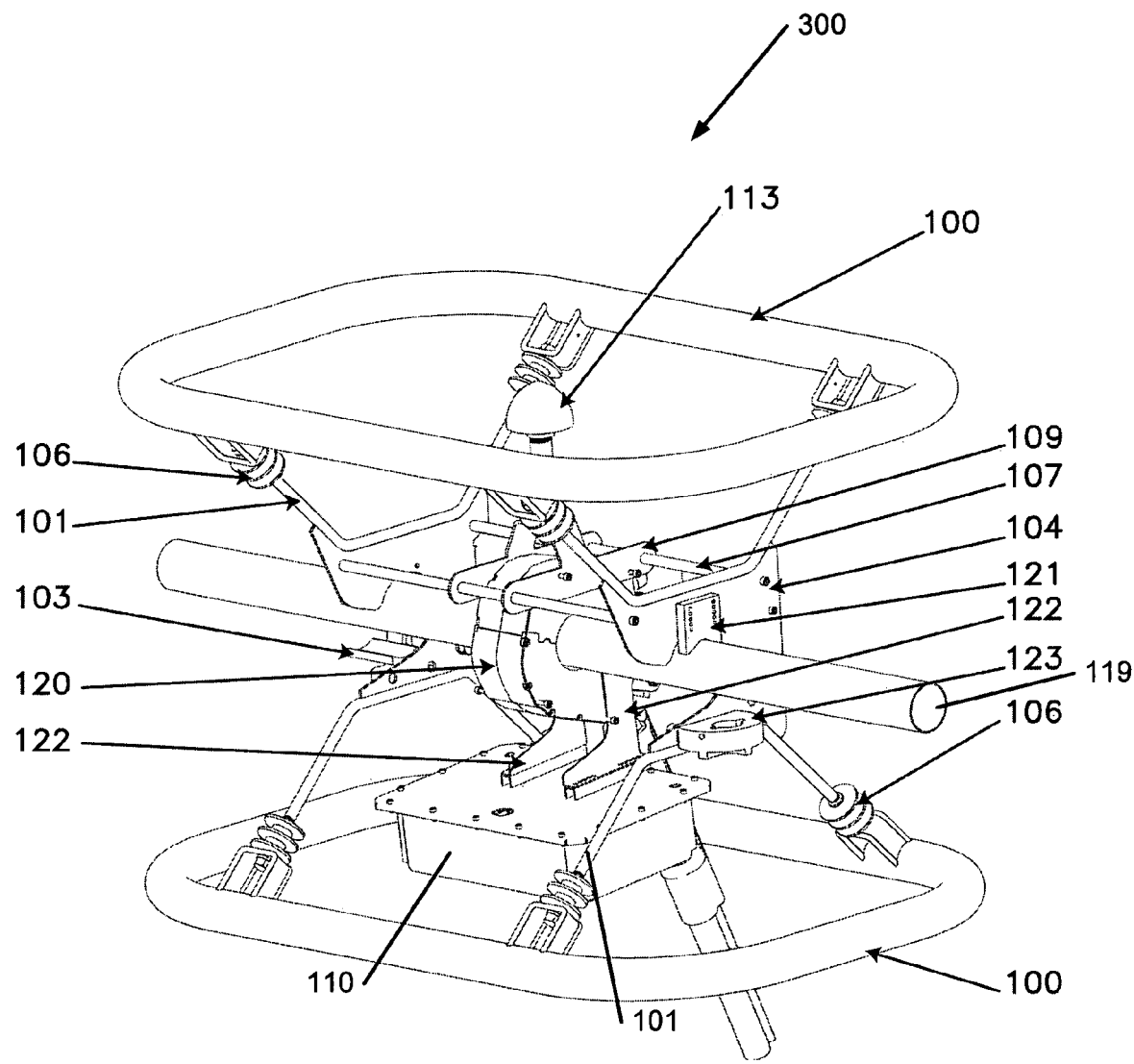
FIG. 6 illustrates a power conductor and a perspective view of another embodiment of the sensor apparatus of FIG. 1.
Figure 7:
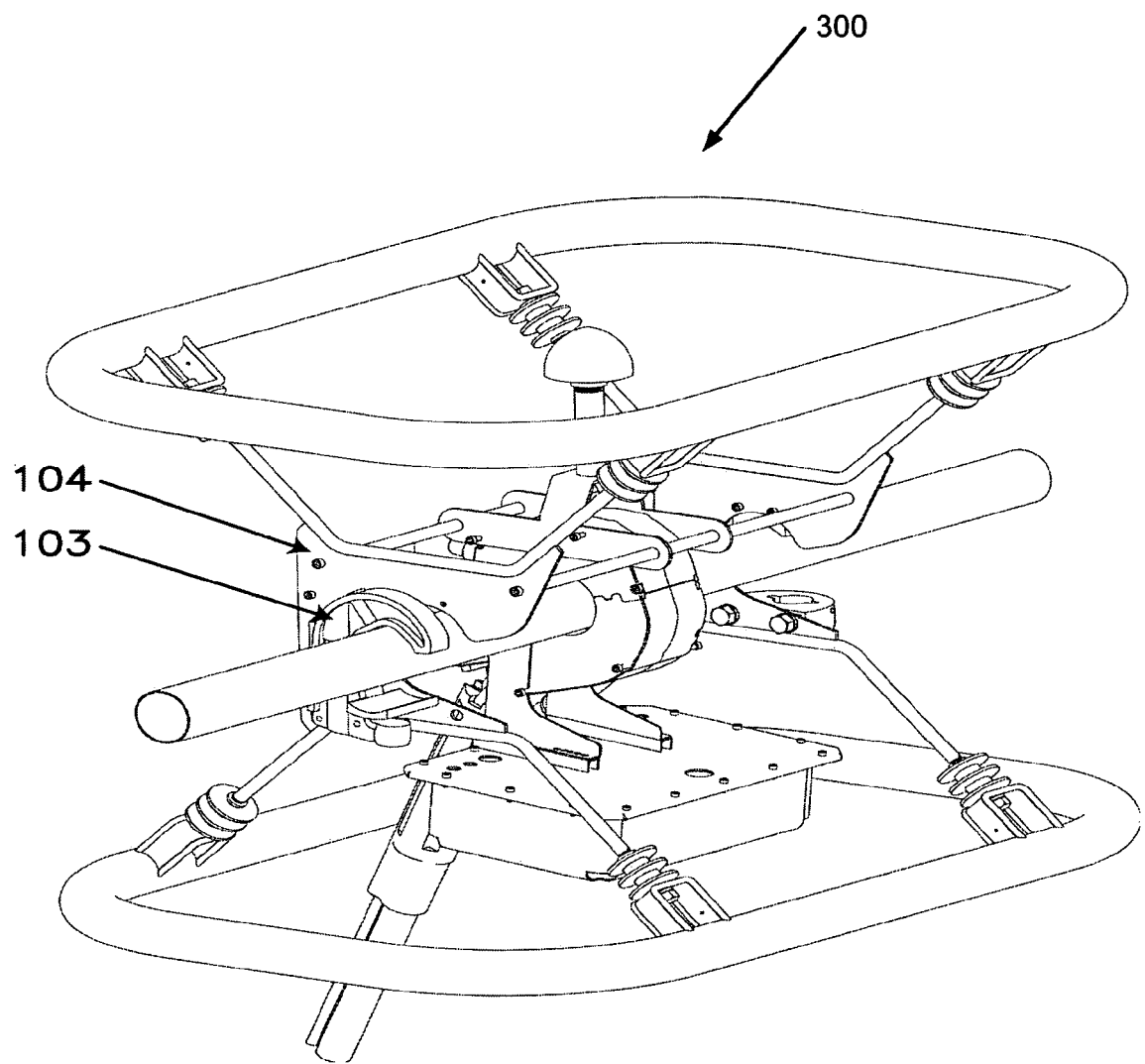
FIG. 7 illustrates a power conductor and a perspective view of yet another embodiment of the sensor apparatus of FIG. 1.

Referring to FIGS. 6 and 7, in another example embodiment of the sensor apparatus 300, insulating blocks 106 may be located between the ends of the guide braces 101 and the corona structures 100. With this placement, the insulating blocks 106 may maintain electrical isolation between the corona structures 100 and the coupling devices 103. Both the coupling devices 103 and a portion of the sensor apparatus 300 that includes the electronic assembly 110 and the current sensor assembly 120, may be at the same potential as the power conductor 119. The mounting plates 104 may be fixedly coupled to the coupling devices 103 such that they form integral units.

As further illustrated in FIGS. 6 and 7 the mounting plates 104 may be removeably coupled to mounting bars 107 that are also coupled to mounting bracket 109. Mounting bracket 109 can be used to couple the corona structure 100 to the current sensor assembly 120. Alternatively, or in addition, mounting brackets 122 may be used to connect the electronics assembly 110 to the current sensor assembly 120.

In the example embodiment of FIGS. 6 and 7, mounting plates 104 may be coupled with one or more coupling devices 103. As illustrated, a single coupling device 103, such as a voltage clamp, can be used and connected to a first one of the mounting plates 104 on one side of the sensor apparatus 300. An insulating block pad 121 may be coupled with a second one of the mounting plates 104 such that the insulating block pad 121 may provide an insulating and mechanical barrier between the power conductor 119 and the second one of the mounting plates 104. A lug 123, such as a hot stick connection bracket may be attached to the second one of the mounting brackets 104 to enable balanced support of the sensor apparatus 300 while the sensor apparatus 300 is installed on the power conductor 119. Where two coupling devices 103, such as voltage clamps, are used, insulation may be disposed between at least one coupling device 103 and the remainder of the sensor apparatus 300 to prevent line current from flowing through the sensor apparatus 300 rather than the power conductor 119, which could affect current measurement accuracy.

Referring now to FIGS. 2-7, the electronics assembly 110 comprises an electronics carriage 111, a sealed connector 112, a first antenna 113, a second antenna 114, a cover 115, a current sensor line 116 and a power supply line 117. In the illustrated example, the electronics carriage 111 may form a housing or pan having an interior area (not shown). The electronics carriage 111 of one example may be positioned at the top of the electronics assembly 110. Alternatively, the electronics carriage 111 may form the side, bottom, top, or any combination, or portions thereof of the electronic assembly 110, or may be installed within a housing of the electronics assembly 110.

Access to an interior area of the electronics carriage 111 for maintenance, etc. may be via the cover 115. The cover 115 may be a removable wall section formed to enclose an opening in the electronics carriage 111, or the housing. The interior area of the electronics carriage 111 may provide a mounting area to mount a plurality of electronic devices, such as a conductor mountable device, a processor, memory, analog-to-digital converters, filters, the power supply and any other electronic devices used to provide the functionality described herein. In addition, electronic devices such as communication and/or signal processing devices associated with the sealed connector 112, the first antenna 113, the second antenna 114, the current sensor line 116, the power supply line 117, and/or any other input output related electronic devices may be included in the interior area. The electronic carriage 111 also may enable coupling of the electronics assembly 110 with the corona structure 100 through mounting bar 105.

The sealed connector 112 may provide an electrical connection to couple with and communicate with internal device electronics without removing the cover 115. For example, a computer, such as a laptop, a personal data assistant (PDA), a specialized terminal, etc., may be coupled with the sealed connector 112 to download and upload data, perform diagnostics, debug, upgrade, etc. The sealed connector 112 may be any form of multi-contact electrical connector that is surface mountable on the electronics assembly 110. The sealed connector 112 may also provide an environmental seal between the internal electronic devices located inside the electronics assembly 110, the multi-electrical contacts and external environmental conditions, such as moisture. The sealed connector 112 may also enable a powered connection to the electronics assembly 110 so the sensor apparatus 300 can be powered prior to installation on a power conductor 119.

The first antenna 113 may enable the sensor apparatus 300 to communicate and receive time and/or position data, or send/receive data depending upon the application, via an external communication device, such as a satellite. For example, the first antenna 113 may include a global positioning system ("GPS") antenna for receiving GPS data from a GPS satellite. The first antenna 113 includes a proximate end and a distal end. The proximate end may be mounted to the electronics assembly 110. The distal end of the first antenna 113 may longitudinal extend away from the electronics assembly 110 a predetermined distance. The distal end of the first antenna 113 may be positioned to minimize exposure of the first antenna 113 to corona discharge. For example, the distal end of the first antenna 113 may be substantially centered with regard to one or more of the corona frame structures included in the corona frame 100. In addition, the first antenna 113 may be positioned to allow a communication path to one or more satellites. In other examples, where the communication path is unaffected by the position of the first antenna 113 and/or the first antenna 113 is impervious to corona discharge, the first antenna may be located elsewhere.

The second antenna 114 may be a radio frequency or radio antenna designed to wirelessly communicate data such as telemetry data to a device external to the sensor apparatus 300. The second antenna 114 may also be mounted on a surface of the electronics assembly 110. The second antenna 114 may be used to communicate to a ground based station. In one example, the second antenna 114 may be a planar type antenna. While other types of radio antennas may be used, such as a whip antenna, the use of the planar type antenna is advantageous because it is low profile, which minimizes wind resistance and corona formation. The radio antenna 114 may be advantageously position on a surface, such as a bottom surface, of the electronics assemble to enable an efficient radiation pattern, and thus more effective usage when the sensor apparatus 300 installed on an elevated power conductor 119. In other examples, one antenna may perform the functionality of both the first antenna 113 and the second antenna 114.

The processor may be any computing device capable of execution of instructions to perform logic. The memory may be any form of data storage device accessible by the processor and/or any other device. The memory may store instructions executable by the processor. In addition, the memory may store installation specific data, measurement data, power parameter data and/or any other data related to the functionality and operation of the sensor apparatus 300. Thus, data provided with the current sensor assembly 120 may be accrued over a period of time in the memory and then periodically transmitted in a batch to an external device, such as a ground based station. In addition, measured and/or determined data may be stored as a backup in the memory in case data transmission is impeded, delayed or some other failure occurs. The data stored in memory may also enable downloading of any current sensor assembly 120 data measurements after removal of the sensor apparatus 300 from the power conductor 119. Further, data storage in memory can be used to omit the need for the second antenna 114, as the measurement data may be retrieved at a later time, instead of communicating the data real-time or at determined intervals with RF communications to a device external to the sensor apparatus 300 during operation on a power conductor 119.

The current sensor assembly 120 may be coupled with the electronics assembly 110 via the current sensor line 116. In one example, the current sensor line 116 is a shielded, flexible multi-conductor cable that is sealed at both the current sensor assembly 120 and the electronics assembly 110 with a weatherproof connector, such as a cable gland. In other examples, any form other form of cable and/or connector may be used. In one embodiment, the data to be transmitted between the current sensor assembly 120 and the electronics assembly 110 may be transmitted wirelessly, such as with Bluetooth communications, and the current sensor line 116 may be omitted.

The power supply line 117 may be coupled between one of the coupling devices 103 and the electronics assembly 110. In one example, the power supply line is a flexible high voltage cable that connects one side of a primary winding included in the power supply included in the electronics enclosure 110 to the power conductor 119 thru the coupling device 103. The power supply line 117 can be sealed with weather proof connectors, such as cable glands, at either or both ends. In addition, or alternatively, the power supply line 117 may be coupled with the coupling device 103 with a fastener, such as a bolt.

FIGS. 8 through 15 illustrate example embodiments of the current sensor assembly 120. The current sensor assembly 120 may repeatably and accurately hold and guide a winding assembly, from an open position, shown in FIG. 8, to a closed position shown in FIG. 9. The current sensor assembly 120 may include a split-core current transformer (CT). In the split-core CT, the winding assembly may be split into a first winding assembly 205 and second winding assembly 206 (FIG. 8) that enable installation of the current sensor assembly 120 to be positioned to surround a portion of a power conductor 119 without needing to break, or open, a continuous power conductor 119. This advantageously allows installation on live power conductors 119 without requiring that power be removed from the power conductor 119.

While closed, the current sensor assembly 120 may also provide protection of the winding assembly from environmental elements, such as moisture and dirt. In addition, the current sensor assembly 120 may include an electrically conductive enclosure that provides an electromagnetic shield for the winding assembly. The current sensor assembly 120 may also include electronic devices related to collection and processing of measured power parameters. Example electronic devices include compensation circuitry, a power supply circuit, amplifiers, signal converters, filters, a communication module, etc. that are related to calibration, measurement and processing of power parameters. In addition, the electronic devices may include memory that can store calibration constants, CT specific information such as an accuracy class, ratios, site information and/or any other data related to the current sensor assembly 120. The electronic devices may be accessed via access covers 165 and 175.

In one embodiment, the current sensor assembly 120 includes body portions that are a first half of a housing 130 and a second half of a housing 135. The first half of a housing 130 and the second half of a housing 135 may be formed of a rigid material, such as metal. The halves of the housing 130 and 135 may fit together and be fixedly held with fasteners 132, to form a first housing assembly 134 and a second housing assembly 136. The first and second housing assemblies 134 and 136 may each be configured to surround a portion of a power conductor and have the respective first and second winding assemblies 205 and 206 disposed therein.

In addition, each of the first and second housing assemblies 134 and 136 may include an outer covering. The outer covering may be a separately attached material, or may be an integrally formed part of the first and second housing assemblies 134 and 136. The outer covering may be constructed of an electrically conductive material to provide electromagnetic shielding. In addition, the outer covering may include environmental shielding properties. The environmental shielding properties may provide a liquid and dust tight enclosure.

Figure 8:
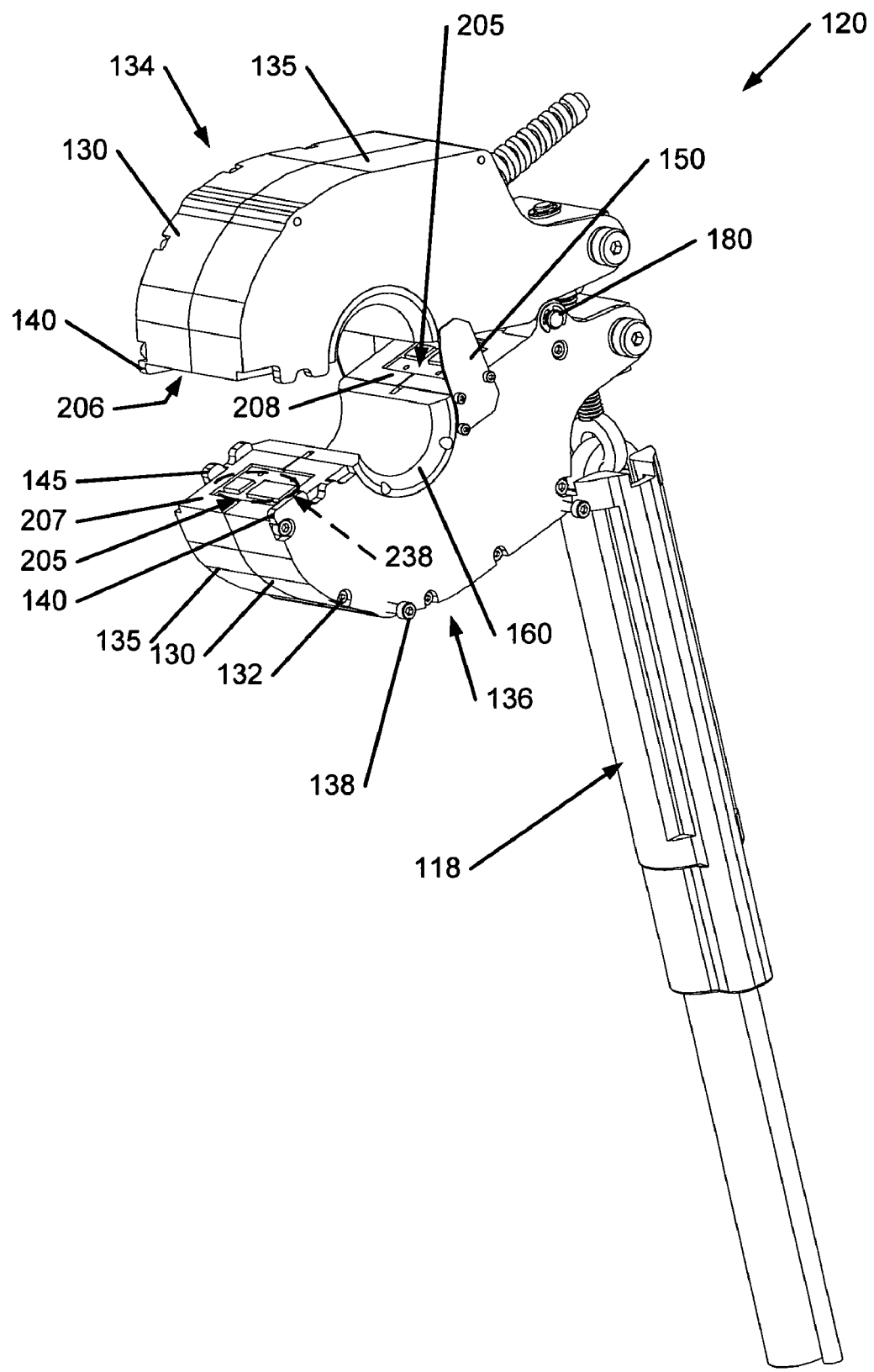
FIG. 8 illustrates a hot stick and an embodiment of a current sensor assembly that can be included in the current apparatus of FIGS. 1-7. The current sensor assembly is depicted in an open position.

As best illustrated in FIG. 8, each of the first and second housing assemblies 134 and 136 also include a first inner mating surface 207 and a second inner mating surface 208. The first and second inner mating surfaces 207 and 208 on each of the first and second housing assemblies 134 and 136 are separated away from each other when the current sensor assembly 120 is in the open position, and are adjacently aligned when the current sensor assembly 120 is in the closed position.

The combined halves of the housings 130, 135 also form an interleaved rotating hinge, about a pin 180 and interlocking teeth 140, 145. The interleaved rotating hinge provides a pivot point to enable the first and second housing assemblies 134 and 136 to be transitioned between the open position and the closed position. The interlocking teeth 140, 145 may extend away from the first inner mating surfaces 207 included on the first and second housing assemblies 134 and 136. The extended interlocking teeth 140, 145 may provide mechanical protection to the exposed surface(s) of the winding assemblies 205 and 206. Mechanical protection may be provided while the current sensor assembly 120 is in the open position and is being guided over a power conductor 119 (FIG. 2) to position the power conductor to be aligned substantially concentric with the current sensor assembly 120. If the power conductor is inadvertently moved into contact with the teeth 140 and 145, the teeth 140 and 145 may prevent damage, such as a scratch or dent on exposed contact surfaces of the winding assemblies 205 and 206. Such damage to the winding assemblies 205 and 206 may potentially render the current sensor assembly 120 inaccurate or inoperable. In addition, the teeth 140 and 145 may also enable the centering of the power conductor 119 concentrically with the current sensor assembly 120.

A shield 150 may be attached to at least one of each of the first and second housing assemblies 134 and 136 adjacent to the second inner mating surfaces 208. The shield 150 may prevent a power conductor from getting pinched between the second mating surfaces 208 when the first and second housing assemblies 134 and 136 transitioned to the closed position. In addition, similar to the teeth 140 and 145, the shield 150 may provide protection to the contact surfaces of the winding assemblies 205 and 206 and enable a power conductor 119 to be concentrically aligned with the current sensor assembly 120. Gaskets may be provided on one or both of the first and second inner mating surfaces 207, 208. When the current sensor assembly 120 is in the closed position, the gaskets may be compressed by the first and second inner mating surfaces 207, 208 to provide a water and dust tight seal for the current sensor assembly 120.

An insulator 160 may be coupled with the first and second housing assemblies 134 and 136 to prevent the conductor from touching any exposed metal surface of the current sensor assembly 120. An electrical isolation, on the order of a few kilovolts, may be produced between the power conductor and the corona frame 100 (FIG. 2) in order for the power supply of the sensor apparatus 150 to provide current at a secondary winding of the power supply. The insulator 160 may maintain this voltage isolation. In the alternative embodiment illustrated in FIGS. 6 and 7, the power supply may be configured such that electrical isolation between the current sensor assembly 120 and the power conductor 119 may not be required. Accordingly, in this embodiment the insulator 160 may be omitted.

In the illustrated embodiment of the current sensor assembly 120, the mechanism for opening and closing the current sensor assembly 120 may be designed to be operated remotely with a hot stick 118. The hot stick 118 may include an opening and closing jaw that can be selectively coupled with a lever 194 included on the current sensor assembly 120. The opening and closing jaw of the hot stick 118 may be selectively coupled with the lever 194 to actuate the current sensor assembly 120 between the open and closed positions.

Figure 9:
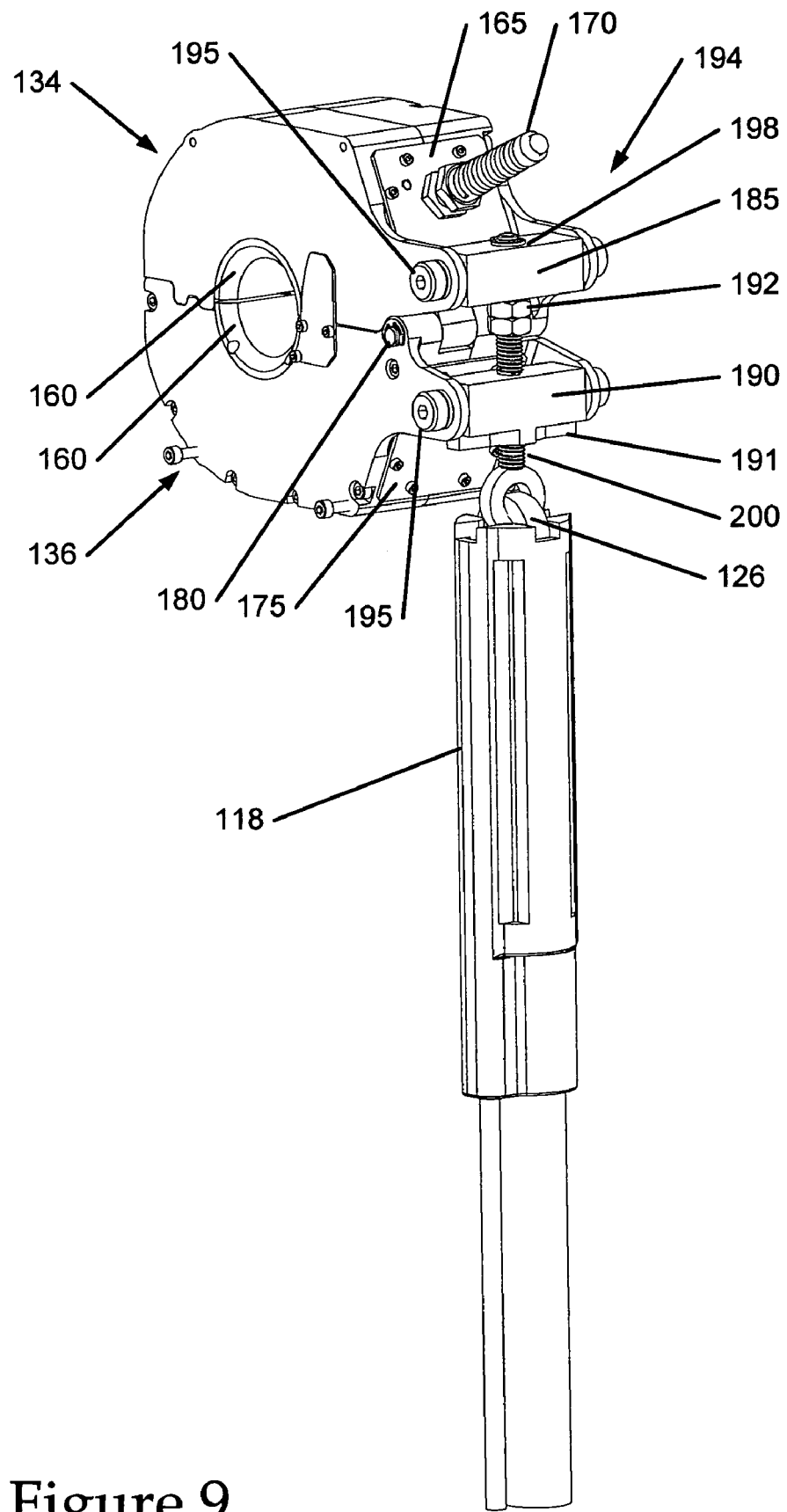
FIG. 9 illustrates a hot stick and an embodiment of the current sensor assembly of FIG. 8 in a closed position.
Figure 10:
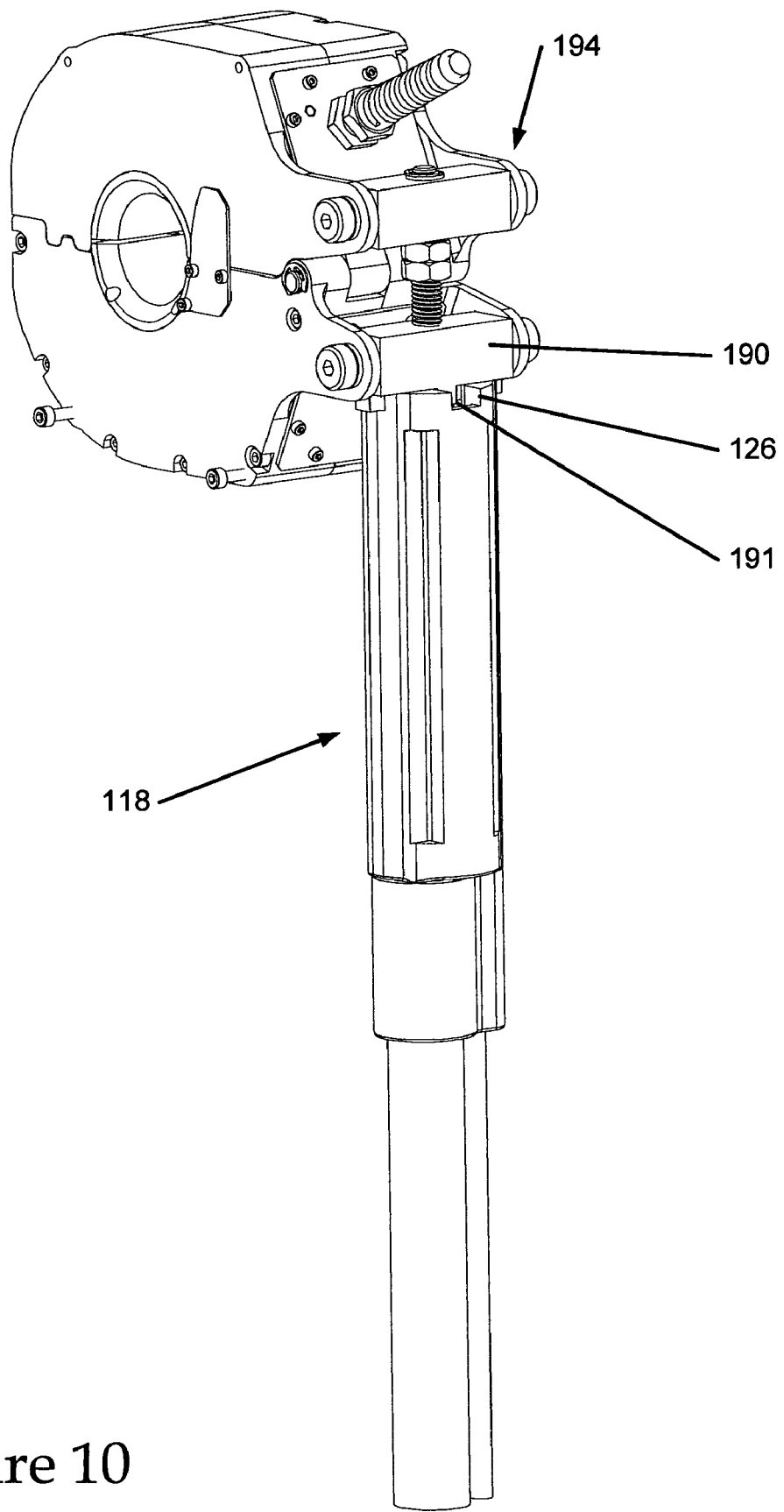
FIG. 10 illustrates an embodiment of the current sensor assembly of FIG. 8 in a closed position with the hot stick fully clamped.

In the embodiment illustrated in FIGS. 8-10, the lever 194 is depicted as a threaded member 200. In this embodiment, the opening and closing jaw of the hot stick 118 may be passed through an eye ring included on the rotatable and threaded member 200. In FIGS. 8 and 9, the example hot stick 118 is depicted in a partially clamped position, and in FIG. 10, the example hot stick 118 is depicted in a fully clamped position. The example threaded member 200 passes through a first member on the second housing assembly 136 such as through a keyed block 190 and through a threaded keyed surface 191.

During operation, when the threaded member 200 is rotated with the hot stick 118, the portion of threaded member 200 above the keyed block 190 becomes longer or shorter, depending on the direction of rotation. The threaded member 200 also passes through a second member on the first housing assembly 134, such as through an unkeyed block 185 and through a plain clearance hole (not shown). The plain clearance hole enables the threaded member 200 to rotate freely within the unkeyed block 185. However, a clip ring 198 and nuts 192 may constrain the threaded member 200 within the unkeyed block in an axial direction of the threaded member 200. Alternatively, the clip ring 198 and nuts 192 may be replaced with a slotted nut and cotter pin, or any other mechanical mechanism to constrain the axial travel of the threaded member 200.

When the threaded member 200 is rotated, axial displacement along the threaded member 200 is created between the keyed block 190 and the unkeyed block 185. This movement is transferred to the first housing assembly 134 through bolts 195, forcing the second housing assembly 136 to rotate about a pin 180 thereby producing the opening and closing action of the current sensor assembly 120. In one example, the keyed surface 191 of keyed block 190 may be formed to fit into a keyed section 126 of an example hot stick 118 when the hot stick 118 mechanism is fully clamped, as illustrated in FIG. 10. This may provide additional stability between the hot stick 118 and the current sensor assembly 120 while it is being installed over a power conductor 119.

In alternative embodiments, other systems and/or mechanisms may be used to actuate the current sensor assembly 120 between the open and closed positions. For example, the latch might be operated by other mechanisms, such as a self-actuated hinge that is remotely operated and/or self powered. In addition, the first and second housing assemblies 134 and 136 of the current sensor assembly 120 may be selectively coupled through any of a variety of mechanisms that allow the current sensor assembly 120 to be opened, aligned with a power conductor, and closed. For example, the first and second housing assemblies 134 and 136 may be joined around a power conductor by the use of magnets, bolts, linkages, a sliding screw, a ball joint, or any other mechanism of joining the first and second housings 134 and 136 in a repeatable manner.

Figure 11:
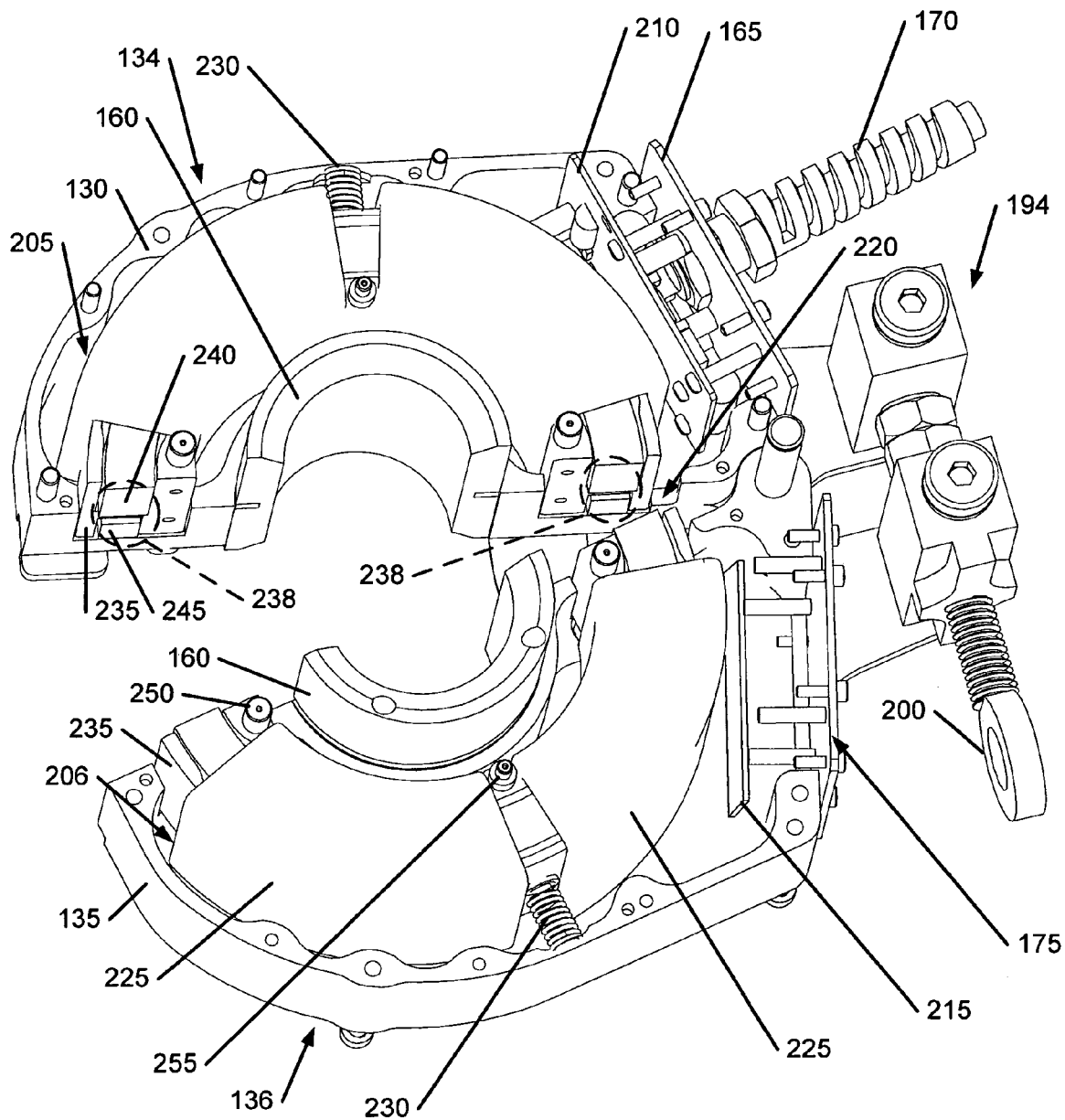
FIG. 11 illustrates an embodiment of the current sensor assembly of FIG. 8 with a portion of the housings removed.

FIG. 11 depicts the current sensor assembly 120 with one of the halves of the housings 135, 130 removed. The electronic devices included in the current sensor assembly 120 may be mounted into the first and second housing assemblies 134 and 136 behind access covers 165, 175. The wiring for the current sensor assembly 120 may exit via a hole formed in access cover 165 and a strain relief 170. The strain relief may be located on the current sensor assembly 120 in a position that provides unobstructed operation of the lever 194 for opening and closing the current sensor assembly 120. Compensation circuitry 210 for the CT cores 240, 245 may be included in the first and/or second housing assemblies 134 and 136, such as mounted to the access cover 165. In one embodiment, during operation, the compensation circuitry 210 may operate to actively compensate a ratio and a phase of the current sensor assembly 120. Accordingly the current sensor assembly 120 may operate with a very low ratio and phase error with respect to the measured line current signal of the power conductor.

In one embodiment, a determined voltage, such as 12 volts DC may be supplied to the current sensor assembly 120 via the current sensor line 116 (FIG. 4). The determined voltage may be supplied from the power supply included in the electronics assembly 110. The compensation circuitry 210 may be powered with the determined voltage. Alternatively, or in addition, a power supply circuit 215 for the compensation circuitry 210 may be optionally provided in the current sensor assembly, such as mounted on access cover 175. The power supply circuit 215 may enable the current sensor assembly 120 to be powered separately, such as with a battery or other power source. Wiring between the power supply circuit 215 and the compensation circuit 201 may be routed in a slot 220 formed in each of the first and second housing assemblies 134 and 136.

The examples of the current sensor assembly 120 depicted in FIGS. 8-15 may also be used separately from the sensor apparatus 300. Use separate from the sensor apparatus 300 may be enabled by the option to include the power supply circuitry 215, behind access cover 175. In an alternative or additional embodiment the power supply 215 may be accessible with a hot stick 118, and may be removed or installed while the sensor apparatus 300 is installed. For example the current sensor assembly 120 may be powered using a power source, such as a battery, and the battery may be installed or removed from the current sensor assembly 120 using a hot stock 118. Thus, a user may modify the power source, such as increase the available power, or replace the battery, if required while the current sensor assembly 120 remains installed on a power conductor.

As illustrated in FIGS. 8 and 11, the current sensor assembly 120 also includes the first and second winding assemblies 205 and 206. The first and second winding assemblies 205 and 206 each comprise a main CT core 240, a compensation CT core 245, a carrier 235, pins 250, 255, a main winding 225 and a compensation winding 292. In the illustrated split-core design, the main CT core 240 and the compensation CT core 245 may each include a plurality of discrete core portions. Thus a first discrete core portion of each of the main CT core 240 and the compensation CT core 245 may be included in the first housing assembly 134 in the first winding assembly 205 and a second discrete core portion of each of the main CT core 240 and the compensation CT core 245 may be included in the second housing assembly 136 in the second winding assembly 206. In the illustrated example, each of the core portions may be formed in a semi-circle within a respective one of the first housing assembly 134 and the second housing assembly 136.

The carrier 235, which may also be referred to as an H-core, may be included in each of the first and second winding assemblies 205 and 206. The carrier 235 may support in at least one dimension the main CT core 240 and the compensation CT core 245. In addition, the carrier 235 may fixedly hold in place the main CT core 240 and the compensation CT core 245. The carrier 235 may be formed with any rigid material, such as plastic, carbon fiber, steel, aluminum, etc. The carrier 235 may also be formed as a single unitary member of single piece construction. Alternatively, the carrier 235 may comprise a plurality of discrete members that are coupled to form the carrier 235. The main CT core 240 and the compensation CT core 245 may be maintained in contact with the carrier 235 with the aid of a bonding agent, such as an adhesive material (for example epoxy), a mechanical fastener, friction fit or any other form of holding mechanism. Alternatively, a holding mechanism external to the carrier 235 may support and/or hold the main CT core 240 and the compensation CT core 245 in contiguous contact with the carrier 235.

In another example, the carrier 235 may be formed with a semi-rigid, or flexible material that allows flexible accommodation of the CT cores 240 and 245. Accordingly, machining and winding tolerances of the CT cores 240 and 245 and the windings 225 and 292 may be larger while still being flexibly accommodated in the carrier 235. Following installation of the CT cores 240 and 245 and the windings 225 and 292 in the carrier 235, the bonding agent may be used to not only maintain contact but also to provide rigidity to the carrier 235. In addition, or alternatively, installation of the CT cores 240 and 245 and the windings 225 in the carrier 235 may provide desirable rigidity to the carrier 235.

Similar to the CT cores 240 and 245, the carrier 235 may also be divided into a plurality of carriers 235 disposed in each of the first housing assembly 134 and the second housing assembly 136. Each of the carriers 235 may be disposed in the first and second winding assemblies 205 and 206 to support the core portions of the main CT core 240 and the compensation CT core 245.

Figure 12:
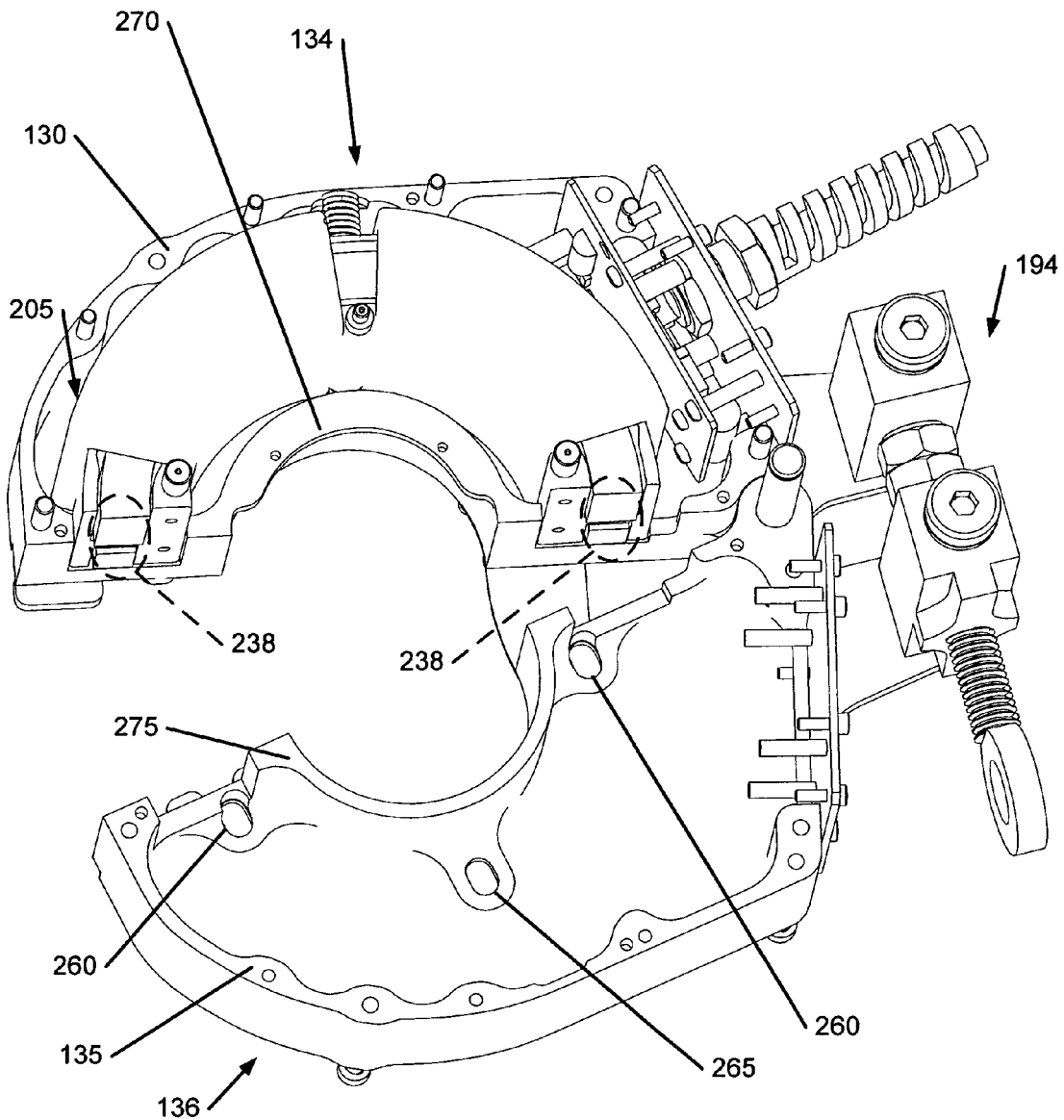
FIG. 12 illustrates an embodiment of the current sensor assembly of FIG. 8 with a portion of the current sensor assembly removed.

Each of the discrete portions of the main CT core 240 and the compensation CT core 245 may include contact surfaces 238 as best illustrated in FIGS. 11 and 12. The main CT core 240 and the compensation CT core 245 may be held in contiguous contact with the carrier 235 so that the contact surfaces 238 of the core portions in the first housing assembly 134 are substantially co-planar and may be accurately mated, or contiguously aligned, with opposing contact surfaces 238 on opposing core portions included in the second housing assembly 136 when the first and second housing assemblies 134 and 136 are moved from the open position (FIG. 8) to the closed position (FIG. 9). Thus, the carrier 235 may initially achieve and substantially maintain alignment of the core portions of main CT core 240 and the compensation CT core 245 so that the contact surfaces 238 are maintained contiguous when the current sensor assembly 120 is in the closed position.

The compensation core 245 may be wound with a compensation winding 292 before being placed in the carrier 235. The compensation core 245 and compensation winding 292 may cooperatively operate to measure a current that is used to compensate for the current measurement of the main CT core 240 and the main CT winding 225. The compensation winding 292 may be coupled with the compensation circuitry 210 to effectively reduce the phase and ratio measurement error of a line current measurement.

The main CT core 240 may be wound with the main CT winding 225. The main CT core 240 and the main CT winding 225 may cooperatively operate to measure an AC current present in a power conductor when the core sections of the main CT core are aligned to surround a portion of the power conductor. The main CT winding 225 may be wound on the main CT core 240 in a plurality of sections. In one example, each of the first and second housing assemblies 134 and 136 may include a core portion of the main CT core 240 wound with two sections of the main CT winding 225. Each section of the main CT winding 225 may also be wound around at least a portion of the carrier 235, the compensation core 245 and the compensation winding 292 included in the respective first and second housing assemblies 134 and 136.

Each carrier 235, and each of the first and second winding assemblies 205 and 206, may be moveable, or slidable, within the respective first and second housing assemblies 134 and, 136. The carriers 235 may be moveable with respect to the respective housing assembly 234 and 236 on pins 250, 255 in slots 260, 265 (FIG. 10). The slots 260 and 265 may be formed in the halves of the housing assemblies 130 and 135. Accordingly, the carriers 235, and each of the first and second winding assemblies 205 and 206, may be moveable in at least one dimension relative to the respective housing assemblies 134 and 136, and restrained from movement relative to the respective housing assemblies 134 and 136 in at least one other dimension. As use herein, the term "dimension" refers to any direction, route or course in three-dimensional space. The respective pins 250, 255 may be fixedly coupled with the carrier 235, and extend outwardly from the carrier 235 to engage the respective slots 260, 265. In other examples, fewer or greater numbers of pins and slots may be included in the current sensor assembly 120.

An elastic component, in this embodiment a spring 230, may be disposed between the first and second housing assemblies 134 and 136 and a respective one of the first and second winding assemblies 205 and 206 moveably positioned therein. The spring 230 may maintain pressure on the respective first or second winding assembly 205 or 206 and/or the carrier 235 to maintain the carrier 235 in a forward biased position within the slots 260 and 265 to enable optimal contact with/between the contact surfaces 238 and alignment thereof.

When the current sensor assembly 120 is closed, the contact surfaces 238 of the CT cores 240, 245 may contact each other, with any misalignment, such as a manufacturing tolerance, being compensated for by movement of the carriers 235, and each of the first and second winding assemblies 205 and 206, sliding in the slots 260, 265. The pins 255, 250 may be of different cross-sectional area, to allow controlled or limited linear and/or rotational motion, such as a rocking action or a rotation of the carriers 235, and each of the first and second winding assemblies 205 and 206, with respect to the housings 134 and 136, as the current sensor assembly 120 is closed. The controlled rocking action and/or rotation may prevent the moving carriers 235 from jamming in the slots 260, 265. Alternatively or in addition, the movement and rotation of the carriers 235, and each of the first and second winding assemblies 205 and 206, with respect to the first and second housings 134 and 136 may be enabled by a variety of other mechanisms, such as adjoining low friction surfaces, flexible linkages, and/or ball bearings. In another example embodiment, the carrier 235, and/or each of the first and second winding assemblies 205 and 206, may be disposed in a compound or substance having elastomeric properties and be desirably moveable with respect to the first and second housings 134 and 136.

When the current sensor assembly 120 is fully closed, one or more springs 230 may maintain a closing force on the contact surfaces 238 of the CT cores 240, 245. Thus, the split core CT's may operate properly, with the core portions of the cores 240, 245 maintained in positive contact with opposed compression forces supplied by the springs 230. The moveable design of carrier 235, and each of the first and second winding assemblies 205 and 206, allows for accurate and automated realignment of the contact surfaces 238 to minimize machining and manufacturing tolerances and misalignments, thus decreasing the cost of assembly and manufacturing of the current sensor assembly 120.

Alternatively, or additionally, the spring 230 may be replaced with other any other mechanism that may exert a force on the carriers 235, and each of the first and second winding assemblies 205 and 206, to push the contact surfaces 238 towards each other, such as an elastomeric block or bumper between the housing assembly 134 or 136 and the carrier 235, rubber bands, o'rings or any other form(s) of spring elements capable of exerting force.

In another embodiment a moveable carrier 235, and corresponding winding assembly, may be present in only one housing assembly 134 or 136, and the cores and windings in the mating housing assembly 134 or 136 may be fixed in place. The movement of the carrier 235 and the corresponding winding assembly within the only one housing assembly 134 or 136 may be such that the contact surfaces 238 of the cores accurately align when the first and second housing assemblies 134 and 136 are brought together in the closed position.

FIG. 12 shows the current sensor assembly 120 with the insulators 160 removed to expose a first inner surface 270 of the first half of the housing assembly 130 included in the first housing assembly 134, and a second inner surface 275 of the first half of the housing assembly 134 included in the second housing assembly 136. As best illustrated in FIG. 14, these inner surfaces 270, 275 may almost come into contact with each other, when the first and second halves of the housing assembly 130 and 135 are coupled to form the first and second housing assemblies 134 and 136.

The inner surfaces 270, 275 may be separated by a gap 290 of a predetermined distance that is defined by the substantially paralleled facing portions of the inner surfaces 270, 275. The gap 290 may provide electrical isolation of the inner surfaces 270, 275. The gap 290 between the inner surfaces 270, 275 may be a predetermined distance that disables electrically conductive contact between the surfaces 270, 275 within the center of the current sensor assembly 120. Such contact could effectively represent a shorted winding turn to the current sensor assembly 120 that may affect measurement. The gap 290 may thus eliminates a conductive path that completely encircles the current sensor assembly 120 and thus ensure a shorted condition is avoided and current is measured properly.

The gap 290 between the inner surfaces 270, 275 may create a small electrical capacitance. The electrical capacitance may operate as a filter by providing what is effectively a shorted transformer turn. Thus, the electrical capacitance generated with the gap 290 may essentially short out any high frequency currents flowing on the power conductor. Accordingly, such high frequency currents may appear at reduced magnitude on the output of the current sensor assembly 120. The overall effect of the gap 290 may be to minimize or eliminate high frequency noise from propagation into the current sensor assembly 120, while desirably allowing the current sensor assembly 120 to properly measure low frequency (such as 50 Hz or 60 Hz) AC currents present in a power conductor.

Figure 14:
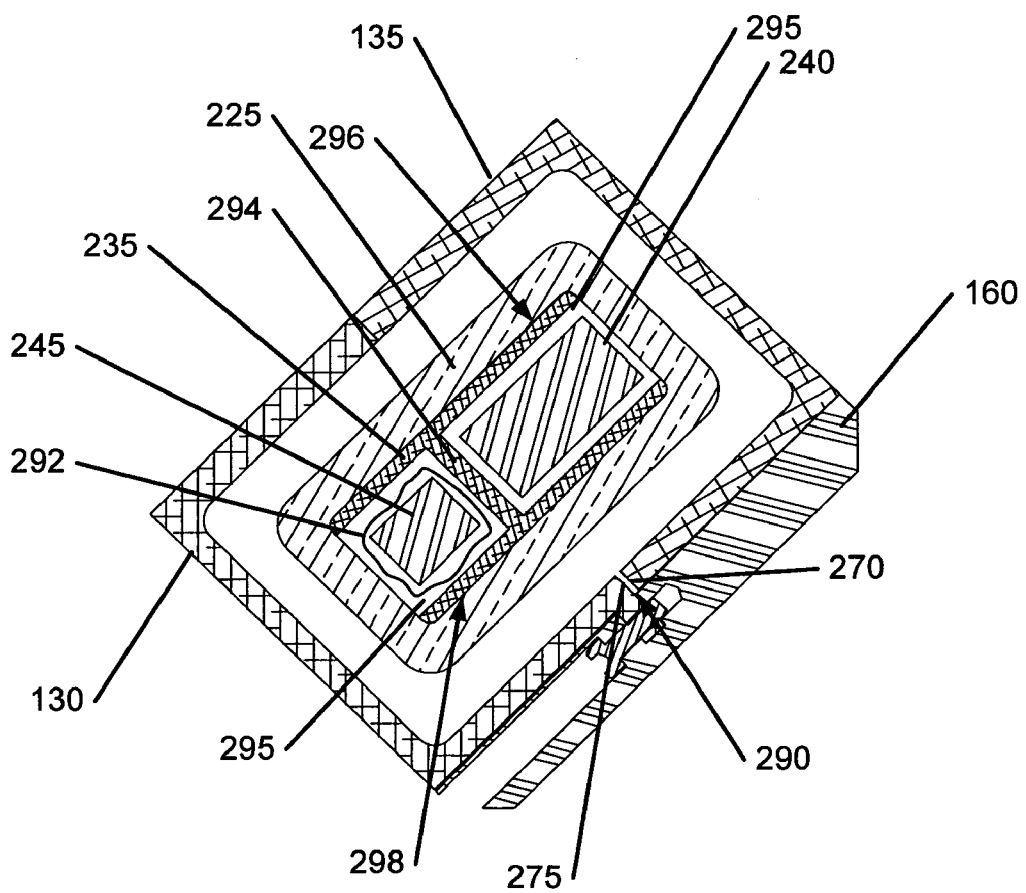
FIG. 14 illustrates a partial cross-section of an embodiment of the current sensor assembly of FIG. 13.

FIG. 14 also depicts the main and compensation CT cores 240 and 245 as being maintained substantially in parallel and at least partially disposed within a respective first channel 296 and a second channel 298 formed adjacently within the carrier 235. Within the first and second channels 296 and 298, the main and compensation CT cores 240 and 245 may be separated by a common wall 294 of the carrier 280. The first channel 296 is formed to accommodate a cross-section of the main CT core 240. The second channel 298 is formed to accommodate a cross-section of the compensation CT core 245 and the compensation winding 292 that has been positioned to surround at least a part of the compensation CT core 245. A bonding agent 295 may also be disposed in the first and second channels 296 and 298. The bonding agent 295 may be in contact with the surface of the CT cores 240 and 245. In addition, or alternatively, the bonding agent 295 may be in contact with a surface of the compensation winding 292. In the illustrated example, the main CT winding 225 is wound to surround the compensation CT core 245, the compensation winding 292, the main CT core 240 and the carrier 235.

As best illustrated in FIGS. 11 and 12, the main and compensation CT cores 240 and 245 are disposed in the respective first and second channels 296 and 298 to extend beyond an end of the first and second channels 296 and 298 by a determined distance. The main and compensation CT cores 240 and 245 extend beyond the end of the carrier 235 so that the carrier 235 will not interfere with alignment and electrical contact between the contact surfaces 238 when the current sensor assembly 120 is in the closed position.

Figure 13:
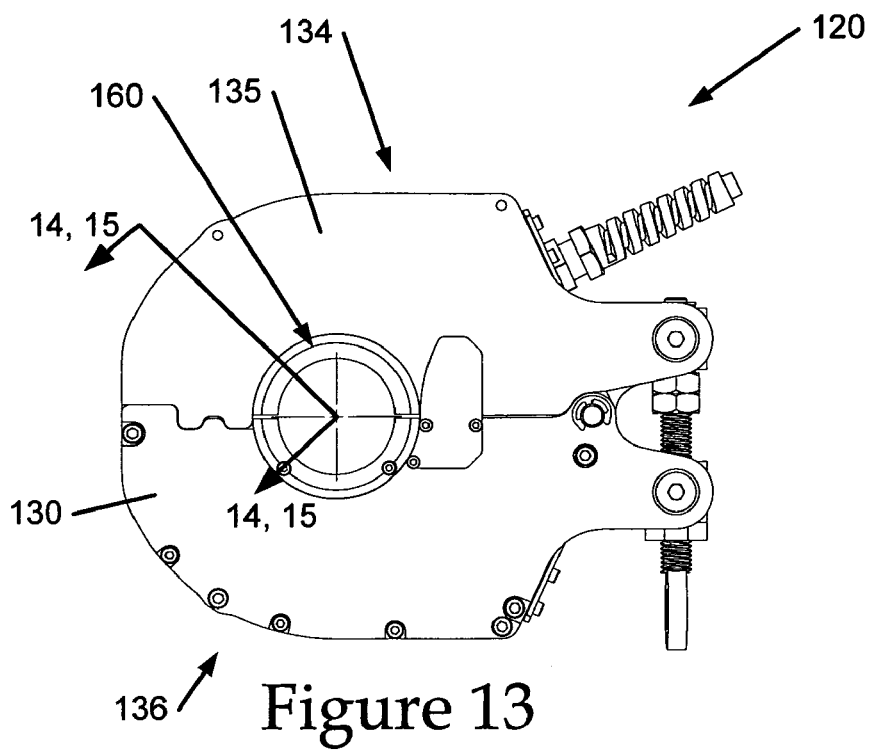
FIG. 13 is a side view of an embodiment of the current sensor assembly of FIG. 8.
Figure 15:
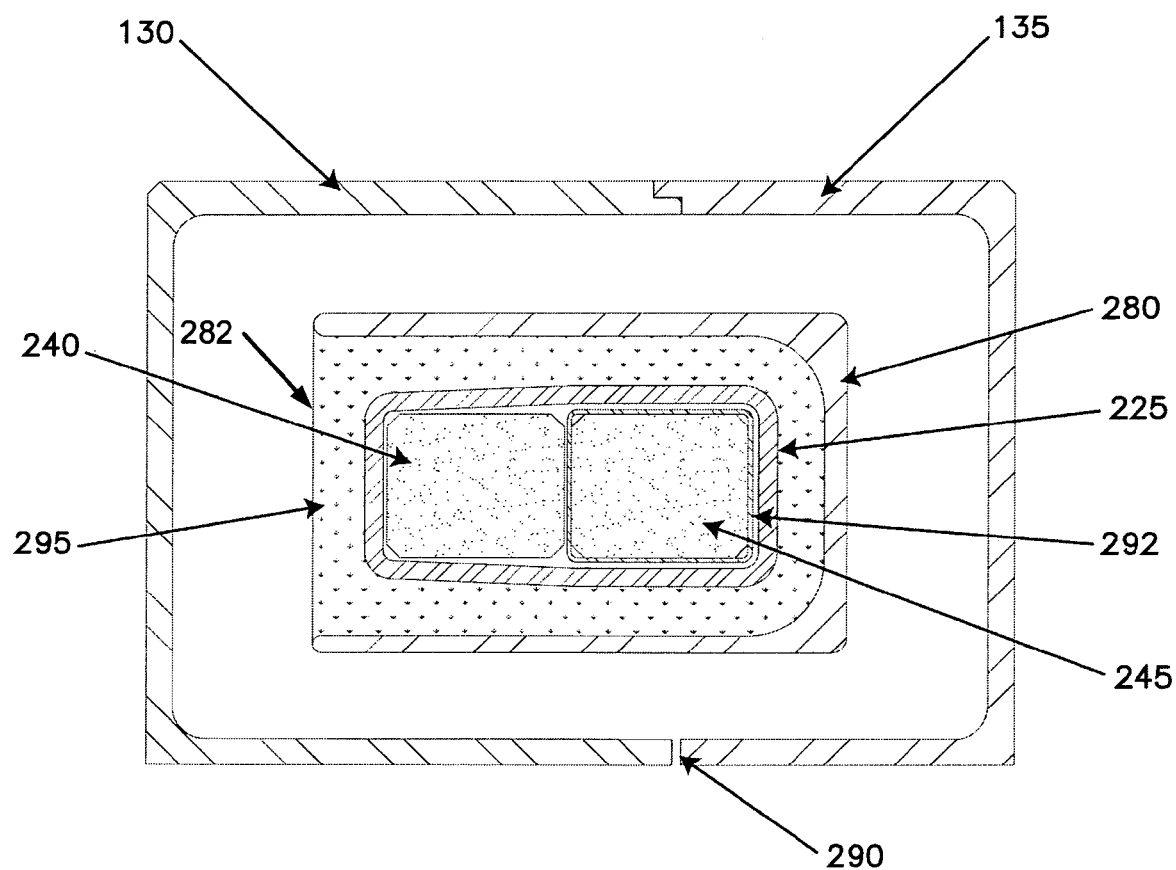
FIG. 15 illustrates a partial cross-section of another embodiment of the current sensor assembly of FIG. 13.

FIG. 15 shows a cross-section of another example of the current sensor assembly illustrated in FIG. 13. In this example embodiment, a carrier 280 with a single channel configuration is depicted. In the single channel configuration of the carrier 280, both the main and the compensation CT cores 240 and 245, and both the main and compensation CT windings 225 and 292 are enclosed in a single channel of the carrier 280. The single channel configuration is formed with three enclosing walls to include an aperture 282 longitudinally extending along the carrier 280. All of the main and the compensation CT cores 240 and 245, and the main and compensation CT windings 225 and 292 may be inserted within the channel through the aperture 282. In the illustrated example, the main CT core 240 is positioned closer to the aperture 282 than the compensation CT core 245. In other examples, any other orientation of the main and the compensation CT cores 240 and 245, and the main and compensation CT windings 225 and 292 may be implemented.

In this example, the main and the compensation CT cores 240 and 245 and the main and compensation CT windings 225 and 292 are maintained substantially in parallel by the carrier 280. Also, in this embodiment a bonding agent 295 may contact and at least partially enclose the cores and windings within the carrier 235. However, in other examples holding mechanisms and/or tolerances and materials for the carrier and cores and windings may make the bonding agent 295 unnecessary. Also, in this example, the main CT winding 225 is wound to surround the compensation CT core 245, the compensation winding 292, and the main CT core 240, but is disposed within the carrier 280. Further, the first half of the housing assemble 130 and the second half of the housing assembly 135 may be combined to form one of the first housing assembly 134 or the second housing assembly 136. The first housing assembly 134 or the second housing assembly 136 may also include the gap 290, as previously discussed. As in the previously described examples, the carrier 280 and the winding assembly may be moveably disposed in the housing.

In example operation, the sensor apparatus 300 of one embodiment may be installed by lineman using hot sticks 118, such as a shotgun hot stick. The hot sticks 118 may be secured to the insulating blocks 102 and coupling devices 103, while the sensor apparatus 300 is lying on its side, such as on the ground. Once the hot sticks 118 are secured, the sensor apparatus 300 may be manually lifted vertically by starting at the device 300 and walking the sensor apparatus 300 to a vertical position so that it is up in the air at the end of the hot sticks 118. Once the sensor apparatus 300 is vertical, the sensor apparatus 300 may be further vertically lifted to an elevated power conductor 119 so that the power conductor 119 come into contact with the guide brace 101. The sensor apparatus 300 could be further vertically lifted using the guide brace 101 to guide the power conductor 119 into the throat of the current sensor assembly 120 and coupling devices 103.

When the power conductor 119 is positioned in the coupling devices 103, a hot stick 118 may be released from the insulating block 102 and used to tighten the coupling device 103 onto the power conductor 119 using the engagement mechanism 108 (see FIG. 3). After the first of two coupling devices 103 are secured, the procedure could be repeated with another hotstick to fully secure the device 300 to the power conductor 119. The final step could be to use one of the hot sticks 118 to couple the current sensor assembly 120 to the power conductor 119 by connecting the hot stick 118 to the threaded member 200 of the current sensor assembly 120 and turning it until the current sensor assembly 120 is fully closed. Alternatively, yet another hot stick 118 may be coupled to the threaded member 200 of the current sensor assembly 120 at the beginning of the procedure, to assist by steadying the sensor apparatus 300 during lifting, and to then close the current sensor assembly 120 when appropriate. In still other alternatives, or in addition, the sensor apparatus 300 may be mounted on the conductor by other remote means. For example the sensor apparatus 300 may be adapted to be mounted by cables or a long insulating pole, such as a hot stick, from a helicopter, crane, bucket truck, by an installer that is attached to the power conductor, and/or by any other remote means.

After installation, the sensor apparatus 300 of one embodiment may be indirectly powered using the electric field from the power conductor 119. In this example embodiment, the sensor assembly 300 may include the power supply. The power supply may include an ultra-high efficiency transformer (not shown). The ultra-high efficiency transformer may have a high voltage primary winding that is electrically connected between the power conductor 119 (via coupling device 103) and the corona structure 100. The transformer may also include a secondary winding. The effective body capacitance of the corona structure 100 may allow an AC current to flow.

The AC current may flow as the free body capacitance charges and discharges in response to the sinusoidal waveform of the line voltage on the power conductor 119. As a result of the AC current flow, a difference in potential between the power conductor 119 and the corona structure 100 may occur. The AC current may magnetize the transformer core via the primary winding and allow a primary voltage of the transformer to build up on the primary winding. An electronic clamping circuit may limit the primary voltage buildup to a predetermined voltage, such as approximately 3 kV. Accordingly, the power supply may develop power to supply devices included in the sensor apparatus 300, as well as supply power to a power connection that may be used to power devices external to the sensor apparatus 300.

An output voltage and current from a secondary winding of the transformer may be stepped down, rectified (or not rectified) and used to power the electronic devices in the electronics assembly 110 and the current sensor assembly 120. The output voltage of the secondary winding may be rectified by a voltage rectifier, such as a full bridge rectifier. For example, a voltage on the current sensor line 116 that may be used to power the current sensor assembly 120 may be stepped down by the transformer and rectified, to generate a determined DC voltage, such as stepped down from approximately 3 KVAC to about 12 VDC. An example power supply with a primary winding coupled between a power conductor and a corona frame is further described in pending U.S. patent application Ser. No. 10/877,742, entitled "Method and Apparatus for Instrument Transformer Reclassification", filed on Jun. 25, 2004, and PCT Patent Application Ser. No. PCT/US2004/23645, entitled "Body Capacitance Electric Body Capacitance Electric Field Powered Device for High Voltage Lines," filed on Jul. 22, 2004, both of which are herein incorporated by reference.

Herein, the phrase "coupled with" or "coupled to" is defined to mean directly connected to or indirectly connected through one or more intermediate components. Such intermediate components may include hardware and/or software based components. Further, to clarify the use in the pending claims and to hereby provide notice to the public, the phrases "at least one of <A>, <B>, . . . and <N>" or "at least one of <A>, <B>, . . . <N>or combinations thereof" are defined by the Applicant in the broadest sense, superseding any other implied definitions herebefore or hereinafter unless expressly asserted by the Applicant to the contrary, to mean one or more elements selected from the group comprising A, B, . . . and N, that is to say, any combination of one or more elements A, B, . . . or N including any one element alone or in combination with one or more of the other elements which may include, in combination, additional elements not listed.

The previously described embodiments of the sensor apparatus 300 describe a mechanical design and a system to install and monitor power parameters on a power conductor 119 such as a high voltage transmission line. The sensor apparatus 300 may also include mechanisms for compensating for inaccuracies in the output of instrument transformers included in a power system. The sensor apparatus 300 may further include a corona frame structure to provide protection from corona discharge and a conductor mountable device that may be used to measure a power parameter such as current.

In one example, the sensor apparatus 300 includes a current sensor assembly 120 that is accurate, self contained, easier to install and easier to use. The sensor apparatus 300 may also include GPS and/or time-syncing capabilities to improve measurement accuracy. In addition, the current sensor assembly 120 may include a housing that can contain operating logic and electronics, such as the power supply and compensation circuitry. The current sensor assembly 120 may also include a split-core current transformer design that includes a pivot mechanism and a carrier moveably disposed in each of a first housing assembly 134 and a second housing assembly 136 that form the housing. The carrier may include discrete portions of the main CT core 240 and the compensation CT core 245, and be moveable with respect to the housing assemblies 134 and 136 to allow contact surfaces 238 included on the discrete cores to be contiguously aligned when the housing is in the closed position.

The sensor apparatus 300 may also include a post installation auto-positioning system that uses weight distribution to position the sensor apparatus 300 with respect to a power conductor 119. In addition, the sensor apparatus 300 may include an installation guidance system. The auto-positioning system and the installation guidance system may provide for easier installation, and the ability to install the sensor apparatus 300 on a live power conductor without having to first interrupt and/or de-energize the power conductor.

Radio frequency antenna(s) may provide communication of telemetry data, GPS timing/position data or both to enable ease of communication with, and use of, the installed sensor apparatus 300. Shieldable and weatherproof coupling mechanisms that are insulated from the corona structure of the sensor apparatus 300 as well as other environmental protective features may also be provided. The sensor apparatus 300 may also have an open frame design. The open frame design may allow for modularity in the sensor apparatus, i.e. allow for the addition of additional components without requiring that those additional components feature a smooth or identical radius as may be required by a corona structure. The open frame design may also enable radio frequency communication with minimized interference, and provide a strong lightweight functional structure that minimizes detrimental effects due to high wind, rain and/or other environmental related conditions. The sensor apparatus 300 may also use capacitive power rather than powering the sensor apparatus 300 directly from the magnetic field of the power line, or power the sensor apparatus 300 from a battery.

It is therefore intended that the foregoing detailed description be regarded as illustrative rather than limiting, and that it be understood that it is the following claims, including all equivalents, that are intended to define the spirit and scope of this invention.

We claim:

1. A current sensor assembly comprising:
   a housing;
   a carrier moveably coupled with said housing and moveable with respect to said housing;
   a plurality of current transformer cores, a main winding, and a compensation winding disposed in said housing, wherein said carrier supports said current transformer cores in at least one dimension and substantially maintains alignment of said current transformer cores; and
   a compensation circuit included in said housing and coupled with said compensation winding, said compensation circuit configured to actively compensate for a ratio and a phase error of a line current measured with said current sensor assembly, wherein said compensation winding encircles at least one of said current transformer cores without encircling said carrier, and said main winding encircles said compensation winding and said current transformer cores.

2. The current sensor assembly of claim 1, wherein:
said current transformer cores comprise a plurality of discrete core portions.

3. The current sensor assembly of claim 2, wherein:
said carrier comprises a plurality of carriers, and
each of said carriers comprises at least one channel that accommodates at least a portion of at least one of said first or said second core portions.

4. The current sensor assembly of claim 3, further comprising a bonding agent operative to fixedly bond at least one of said discrete core portions with at least one of said carriers.

5. The current sensor assembly of claim 2, wherein said discrete core portions include a first core portion and a second core portion that are aligned to form a main core that surrounds a portion of a conductor and measure an AC current.

6. The current sensor assembly of claim 5, wherein said discrete core portions include a third .core portion and a fourth core portion that are aligned to form a compensation core that compensates measurement by said main core.

7. The current sensor assembly of claim 1, wherein said carrier comprises at least one channel formed to accommodate at least one of said transformer cores.

8. The current sensor assembly of claim 1, wherein said carrier is fixedly coupled with a pin and said housing is formed with a slot, wherein said pin extends from said carrier and is disposed in said slot to moveably coupled said carrier with said housing.

9. The current sensor assembly claim 1, further comprising a bonding agent that fixedly bonds said transformer cores with said carrier.

10. The current sensor assembly of claim 1, wherein said carrier comprises at least one channel, said at least one channel formed to accommodate a combined cross-section of said compensation winding and said one of said current transformer cores.

11. The current sensor assembly of claim 10, further comprising a bonding agent disposed in said first channel in contact with a surface of said compensation winding and said one of said current transformer cores.

12. The current sensor assembly of claim 1, further comprising an electronic assembly included in the current sensor assembly, the electronic assembly comprising a communication circuit and a power supply operable to supply power to said current sensor assembly.

13. A current sensor assembly comprising:
a first housing assembly and a second housing assembly configured to each surround a portion of a conductor; and
a first winding assembly movably disposed in said first housing assembly, and a second winding assembly movably disposed in said second housing assembly;
wherein said first housing assembly and said second housing assembly are transitional between an opening position and a closed position, and
wherein said first winding assembly and said second winding assembly are movable with respect to said first housing assembly and said second housing assembly, respectively, to align said first winding assembly with said second winding assembly, and
wherein at least one of said first housing assembly or said second housing assembly, or combinations thereof, comprises a current sensor electronic device configured to process a measured power parameter, wherein said current sensor electronic device includes compensation circuitry configured to actively compensate for ratio and phase errors.

14. The current sensor assembly of claim 13, wherein said first housing assembly and said second housing assembly are positionable apart in said open position to enable placement of said first housing assembly and said second housing assembly to partially surround a conductor.

15. The current sensor assembly of claim 13, wherein said first winding assembly comprises a first contact surface and said second winding assembly comprises a second contact surface, wherein said first contact surface and said second contact surface are separated when said first housing assembly and said second housing assembly are in said open position, and said first contact surface and said second contact surface are contiguously aligned when said first housing assembly and said second housing assembly are in said closed position.

16. The current sensor assembly of claim 13, wherein each of said first housing assembly and said second housing assembly are formed to define a slot and each of said first winding assembly and said second winding assembly comprise a pin positioned to be disposed in said slot.

17. The current sensor assembly of claim 13, wherein each of said first winding assembly and said second winding assembly comprise a carrier and a plurality of current transformer cores disposed in said carrier.

18. The current sensor assembly of claim 13, wherein said first housing assembly and said second housing assembly comprise inner mating surfaces that mateably align when said first housing assembly and said second housing assembly are positionable together in said closed position, wherein said inner mating surfaces comprise interlocking teeth.

19. The current sensor assembly of claim 18, wherein said interlocking teeth extend away from said inner mating surfaces a determined distance to protect a contact surface included on each of said first winding assembly and said second winding assembly when said first housing assembly and said second housing assembly are in said open position and are positionable to partially surround a conductor.

20. The current sensor assembly of claim 19, further comprising a shield coupled with at least one of the first housing assembly and said second housing assembly, wherein said shield enables said first housing assembly and said second housing assembly to be centered on a conductor.

21. The current sensor assembly of claim 13, wherein said pivot point comprises an interleaved rotating hinge formed to be part of said first housing assembly and said second housing assembly.

22. The current sensor assembly of claim 21, wherein said pivot point comprises an interleaved rotating hinge formed to be part of said first housing assembly and said second housing assembly, or combinations thereof, comprises a power supply circuit.

23. The current sensor assembly of claim 13, wherein at least one of said first housing assembly and said second housing assembly, or the combination thereof, are configured to receive a hotstick and are operative to be manually transitioned between said open position and said closed position with said hotstick.

24. The current sensor assembly of claim 13, wherein at least one of said first housing assembly or said second housing assembly, or combinations thereof, comprises a power supply circuit.

25. The current sensor assembly of claim 24, wherein said power supply circuit comprises a battery.

26. The current sensor assembly of claim 13, wherein said first housing assembly and said second housing assembly each comprise a body and an outer covering, and said body and said outer covering are constructed of electrically conductive material.

27. The current sensor assembly of claim 26, wherein said body and said outer covering provide both an electromagnetic shield and an environmental shield, and wherein said environmental shield is operative as a liquid and dust tight enclosure.

28. The current sensor assembly of claim 13, wherein said first housing assembly and said second housing assembly each comprise a plurality of surfaces that are positionable adjacent a conductor, said surfaces being separated by a nonconductive gap to eliminate a conductive path there between.

29. The current sensor assembly of claim 13, wherein said first winding assembly and said second winding assembly are contiguously aligned when said first housing assembly and said second housing assembly are in said closed position to surround said conductor, and are spaced apart from each other in said open position.

30. The current sensor assembly of claim 13, wherein said first winding assembly and said second winding assembly comprise a plurality of current transformer cores.

31. The current sensor assembly of claim 13, wherein said first housing assembly and said second housing assembly each comprising an inner surface operative to be next adjacent said conductor and, when in said closed position, are positioned in parallel and separated by a gap formed to minimize high frequency noise.

32. The current sensor assembly comprising:
a first housing assembly and a second housing assembly configured to each surround a portion of a conductor;
a first winding assembly movably disposed in said first housing assembly, and a second winding assembly movably disposed in said second housing assembly;
wherein said first housing assembly and said second housing assembly are operative to be transitional between an open position and a closed position, and wherein said first winding assembly and said second winding assembly are movable with respect to said first housing assembly and said second housing assembly, respectively, to align said first winding assembly with said second winding assembly; and
an elastic component disposed between at least one of said first housing assembly and said first winding assembly or between said second housing assembly and said second winding assembly, wherein said elastic component is operative to apply a force to said first winding assembly or said second winding assembly to contiguously align a contact surface included on each of said first winding assembly and said second winding assembly when said first housing assembly and said second housing assembly are in said closed position.

33. A sensor apparatus mountable on a power conductor, the sensor apparatus comprising:
a current sensor assembly operative to sense current in a power conductor;
an electronics assembly included within said current sensor assembly;
wherein said current sensor assembly further comprises a housing with a main winding, a compensation winding, a plurality of transformer cores, and a carrier disposed therein,
wherein said carrier is operative to support said transformer cores in parallel in at least one dimension, and is operative to be moveable with respect to said housing,
wherein said compensation winding encircles at least one of said transformer cores without encircling said carrier, and said main winding encircles said compensation winding and said current transformer cores; and
wherein said electronics assembly comprises a communication circuit and a power supply operative to supply power to said current sensor assembly.

34. The sensor apparatus of claim 33, wherein said power is derivable from at least one battery coupled to said current sensor assembly.

35. The sensor apparatus of claim 33, wherein said electronics assembly is at least partially enclosed in said housing.

36. The sensor apparatus of claim 33, wherein said communication circuit is operative to at least one of transmit data or receive at least one of time data and geographic position data, or combinations thereof.

37. The sensor apparatus of claim 33, wherein said communication circuit is operative to enable communication between said current sensor assembly and a ground based processor that is external to said sensor apparatus.

38. The sensor apparatus of claim 33, wherein said power supply comprises a transformer that includes a primary winding and a secondary winding, wherein said power conductor is electrically coupled with said primary winding, and said secondary winding is operative to supply power to said current sensor assembly and said electronics assembly.

* * * * *

UNITED STATES PATENT AND TRADEMARK OFFICE
CERTIFICATE OF CORRECTION

PATENT NO. : 7,557,563 B2  Page 1 of 1
APPLICATION NO. : 11/335793
DATED : July 7, 2009
INVENTOR(S) : Colin N. Gunn et al.

It is certified that error appears in the above-identified patent and that said Letters Patent is hereby corrected as shown below:

In column 21, line 11, please delete "first or said second core portions" and insert --discrete core portions--.

In column 21, line 13, please delete "operative to fixedly bond" and insert --that fixedly bonds--.

In column 21, line 40, please delete "first channel" and insert --at least one channel--.

In column 21, line 57, please delete "opening" and insert --open--.

In column 22, line 32, please delete "positionable" and insert --positioned--.

In column 22, line 42, please delete "the" between "of" and "first" and insert --said-- between "of" and "first".

In column 22, lines 54-55, please delete "or combinations thereof, comprises a power supply circuit".

Signed and Sealed this

Twenty-fifth Day of August, 2009

David J. Kappos
*Director of the United States Patent and Trademark Office*